(12) United States Patent
Parthasarathy

(10) Patent No.: US 10,855,314 B2
(45) Date of Patent: Dec. 1, 2020

(54) GENERATING AND USING INVERTIBLE, SHORTENED BOSE-CHAUDHURI-HOCQUENGHEM CODEWORDS

(71) Applicant: Micron Technology, Inc., Boise, ID (US)

(72) Inventor: Sivagnanam Parthasarathy, Carlsbad, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 131 days.

(21) Appl. No.: 16/007,806

(22) Filed: Jun. 13, 2018

(65) Prior Publication Data
US 2019/0253080 A1   Aug. 15, 2019

Related U.S. Application Data

(60) Provisional application No. 62/628,821, filed on Feb. 9, 2018.

(51) Int. Cl.
*H03M 13/15* (2006.01)
*G11C 29/52* (2006.01)
*G06F 11/10* (2006.01)

(52) U.S. Cl.
CPC ....... *H03M 13/155* (2013.01); *G06F 11/1012* (2013.01); *G06F 11/1068* (2013.01); *G11C 29/52* (2013.01); *H03M 13/152* (2013.01)

(58) Field of Classification Search
CPC ............. H03M 13/155; H03M 13/152; G06F 11/1012; G11C 11/1068; G11C 29/52

USPC ......................................... 714/758, 766, 779
See application file for complete search history.

(56) References Cited

U.S. PATENT DOCUMENTS

| 7,266,760 B1 * | 9/2007 | Bain .................... H03M 13/091 714/807 |
| 8,656,231 B1 | 2/2014 | Huang et al. |
| 2009/0094411 A1 | 4/2009 | Que |
| 2011/0060965 A1 * | 3/2011 | Kwon .................. G06F 11/1068 714/758 |
| 2011/0239094 A1 | 9/2011 | Kwok et al. |
| 2011/0276856 A1 | 11/2011 | Litsyn et al. |

(Continued)

OTHER PUBLICATIONS

International Search Report and Written Opinion for Application No. PCT/US2019/016678, dated May 20, 2019, 11 pages.

*Primary Examiner* — James C Kerveros
(74) *Attorney, Agent, or Firm* — Nicholson De Vos Webster & Elliott LLP

(57) ABSTRACT

A computer-implemented method for using invertible, shortened codewords is described. The method includes receiving a request to store user data bits in a set of memory devices; expanding the user data bits and an inversion bit to bit locations of a codeword template, wherein the expanding forms expanded inversion and user data bits that collectively include additional bits to represent the user data bits and the inversion bit; generating parity bits for the expanded inversion and user data bits to form a shortened codeword, wherein the shortened codeword comprises the expanded inversion and user data bits, and the parity bits; compressing the shortened codeword to form a compressed shortened codeword; and storing the compressed shortened codeword in the set of memory devices.

18 Claims, 30 Drawing Sheets

(56) References Cited

U.S. PATENT DOCUMENTS

| | | | |
|---|---|---|---|
| 2011/0283166 A1* | 11/2011 | Kim | G06F 11/106 |
| | | | 714/773 |
| 2014/0122964 A1* | 5/2014 | Chen | H03M 13/05 |
| | | | 714/758 |
| 2015/0082132 A1* | 3/2015 | Jeong | H03M 13/2906 |
| | | | 714/776 |
| 2015/0220387 A1 | 8/2015 | Kwok et al. | |
| 2018/0041228 A1* | 2/2018 | Park | H03M 13/116 |
| 2018/0076926 A1* | 3/2018 | Zhang | H04L 1/0065 |

\* cited by examiner

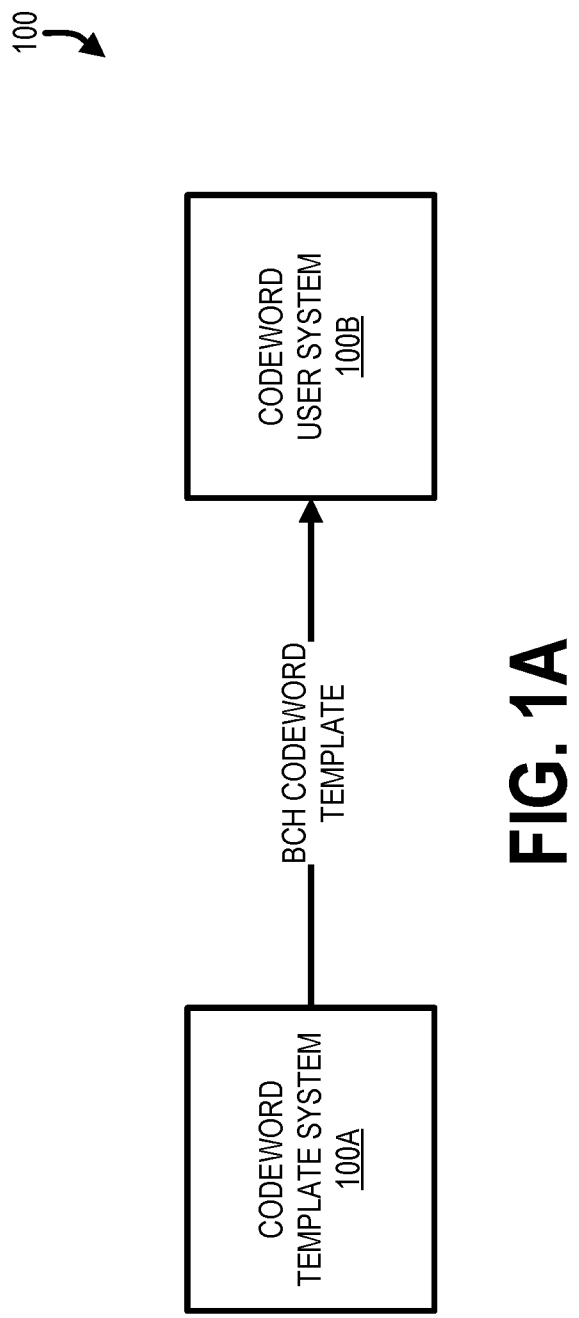

GENERATING AND USING INVERTIBLE, SHORTENED BOSE-CHAUDHURI-HOCQUENGHEM CODEWORDS

CROSS-REFERENCE TO RELATED APPLICATIONS

The present application claims the benefit of U.S. Provisional Patent Application No. 62/628,821, filed on Feb. 9, 2018, which is hereby incorporated by reference.

FIELD OF THE INVENTION

The various embodiments described in this document relate to encoding user data. In particular, embodiments include systems and methods for generating shortened Bose-Chaudhuri-Hocquenghem (BCH) codewords that, when inverted, remain valid BCH codewords.

BACKGROUND OF THE INVENTION

Many new types of memories suffer from imprint issues, whereby residual effects from a pattern written to a set of memory cells remain or persist even after the cells have been rewritten. For example, a set of memory cells may have been initially written with a first bit pattern of "11011" and the memory cells may be subsequently written with a second bit pattern of "01101". When imprint issues are present, remnants of the first bit pattern may remain even after the writing of the second bit pattern. This may cause the memory cells to improperly/inaccurately store the second bit pattern. For example, instead of storing the second bit pattern of "01101" after the second write described above, the memory cells may store the bit pattern "01111". In this example, the second bit position incorrectly shows a bit value of "1" instead of a bit value of "0" based on an imprint issue caused by the first bit pattern.

Imprint issues may be the result of memory cells remaining in a particular state (e.g., remaining set or remaining unset) for an extended period of time. To address imprint issues, memory controllers may compliment/invert data values within memory cells at a frequency dictated by the media to ensure reliability of data stored therein. Inverting encoded data values within cells requires that a codeword stored in memory, including user data bits and parity bits, must be able to be inverted and reliably decoded without compromising a User Bit Error Rate (UBER) and/or an Undetectable Error Rate (UDER) (i.e., mis-correction). This is only possible if the inverted codeword will continue to be a valid and correct codeword. In particular, parity bits of a codeword, when inverted, are valid parity bits for the inverted user data bit portion of the codeword (i.e., correct for errors in the inverted user data bits and do not provide mis-correction). For example, in the case of Bose-Chaudhuri-Hocquenghem (BCH) codewords, to avoid costly decoding prior to inversion, an inverted BCH codeword must also produce a valid BCH codeword. Although full-length BCH codewords are valid BCH codewords when inverted, shortened BCH codewords are not typically valid BCH codewords when inverted.

BRIEF DESCRIPTION OF THE DRAWINGS

The present invention is illustrated by way of example and not limitation in the figures of the accompanying drawings, in which like references indicate similar elements, and in which:

FIG. 1A is a functional block diagram of a codeword system, including a codeword template system and a codeword user system, in accordance with one or more embodiments;

DETAILED DESCRIPTION

Figure 1B:
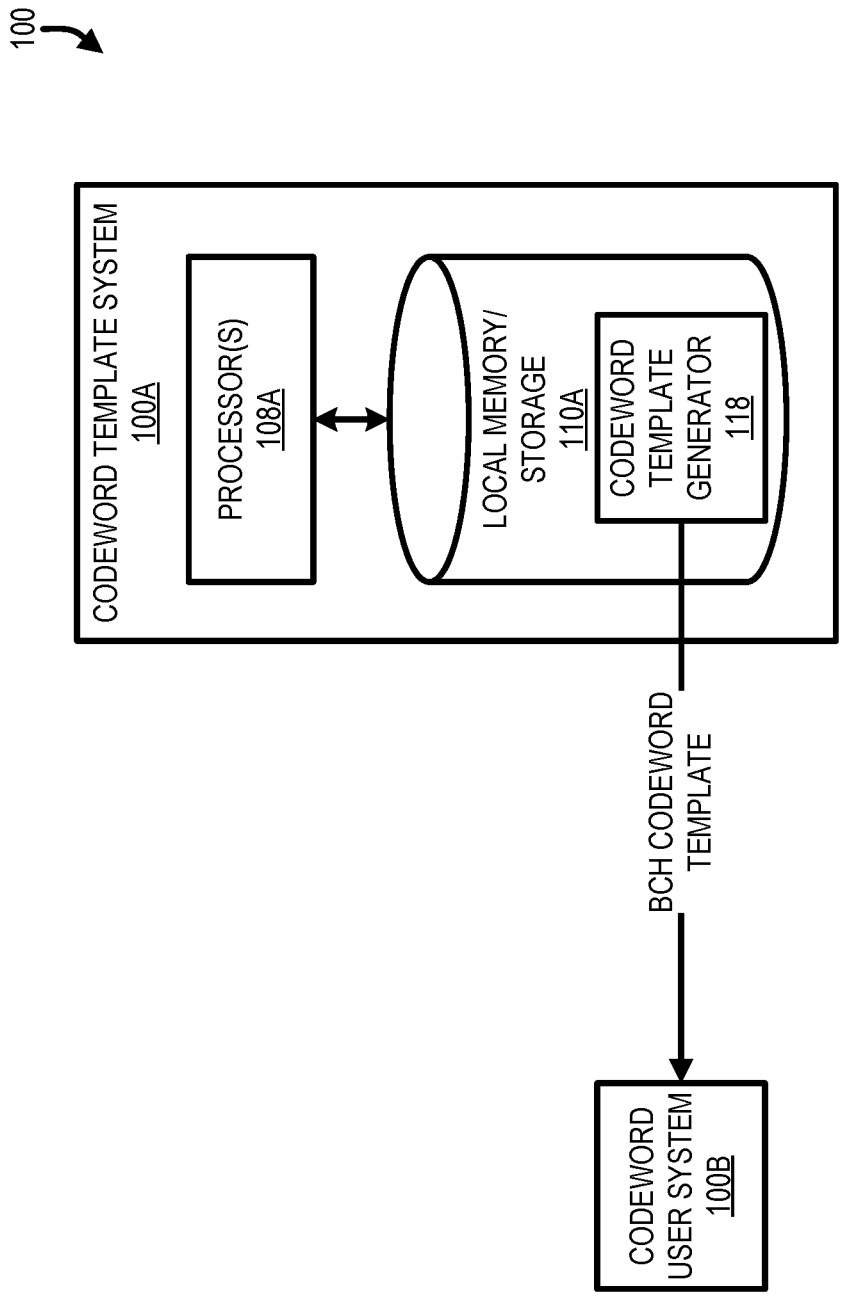
FIG. 1B is a functional block diagram of the codeword template system, in accordance with one or more embodiments.

Systems, methods, and devices are described herein for generating valid shortened Bose-Chaudhuri-Hocquenghem (BCH) codewords that, when inverted, remain valid BCH codewords (e.g., inverted parity bits correct for errors in a user data bit portion of the shortened BCH codeword without mis-correction). In particular, generation of a shortened BCH codeword includes determining a BCH codeword template. The BCH codeword template indicates the positions of an inversion bit, user data bits received from a host system, and parity bits to produce corresponding shortened BCH codewords that are still valid BCH codewords even after inversion. This allows inversion of the shortened BCH codeword in memory devices to reduce imprint issues while still ensuring that the representation of the codeword in the memory devices (i.e., in an inverted or normal/original condition) can be correctly decoded by a BCH decoder (i.e., mis-correction or undecodable codewords are avoided). As will be described below, shortened BCH codewords allow the use of various sizes for user data bits regardless of the number of available bits (e.g., the number of user data bits may be a power of two and one or more extra bits reserved for the codeword may be unused) and avoids processing overhead for larger numbers of user data bits when a larger number of user data bits is unnecessary for encoding data. Accordingly, the systems, methods, and devices described herein for generating shortened BCH codewords takes advantage of the benefits of shortened BCH codewords (e.g., flexibility with the number of user data bits and lower processing overhead) while still allowing these codewords to be inverted and decoded to minimize/avoid memory imprint issues. Several details for generating and using shortened BCH codewords will now be described by way of example. Although discussed in relation to BCH codewords, the same or similar techniques may be employed for any cyclic codeword. A set of codewords are cyclic codewords if rotating each of the codewords in the set of codewords to the right (circular shift to the right) and to the left (circular shift to the left) produces a valid codeword (i.e., a codeword within the set of codewords).

FIG. 1A is a functional block diagram of a codeword system 100. The codeword system 100 includes a codeword template system 100A and a codeword user system 100B. As will be described in greater detail below, the codeword template system 100A generates a BCH codeword template that is provided to the codeword user system 100B to generate shortened BCH codewords. In particular, the BCH codeword template indicates the positions of an inversion bit, user data bits received from a host system, and parity bits to produce corresponding shortened BCH codewords that are still valid BCH codewords even after inversion (e.g., inverted parity bits correct for errors in a user data bit portion of the shortened BCH codeword without mis-correction). This allows inversion of a shortened BCH codeword in memory devices to reduce imprint issues while still ensuring that the representation of the codeword in the memory devices (i.e., in an inverted or normal/original condition) can be correctly decoded by a BCH decoder (i.e., mis-correction or undecodable codewords are avoided).

FIG. 1B is a functional block diagram of the codeword template system 100A, in accordance with one or more embodiments of the present disclosure. The codeword template system 100A can utilize one or more processors 108A and/or local memory/storage 110A for use in generating BCH codeword templates via the codeword template generator 118. As will be described in greater detail below, the codeword template generator 118 generates BCH codeword templates for invertible, shortened BCH codewords used by the codeword user system 100B. The processor 108A can be a central processing unit, microprocessor, integrated circuit, field programmable gate array, or other circuitry to read, write, and may maintain memory content as well as perform the embodiments set forth in this document and described.

Figure 1C:
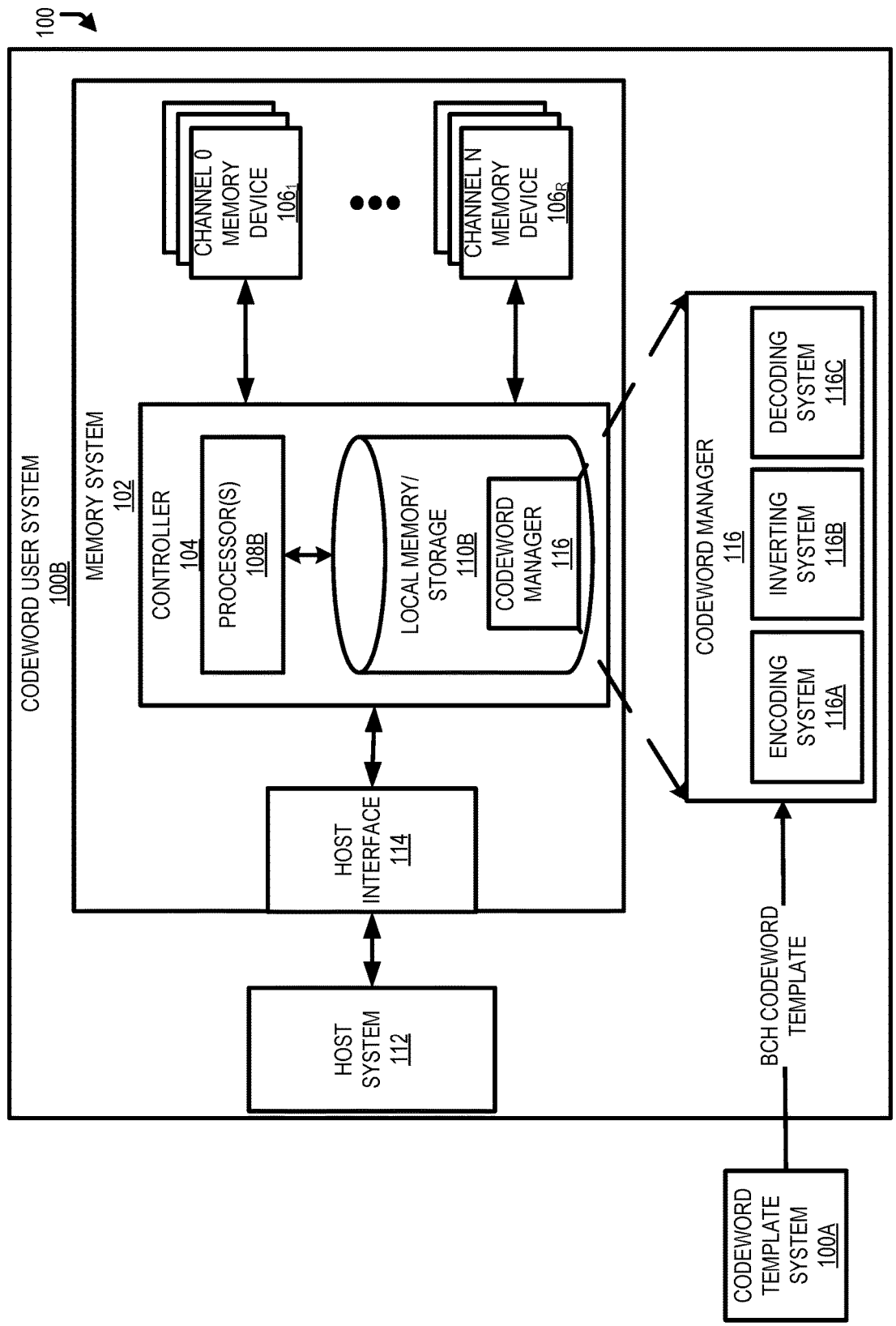
FIG. 1C is a functional block diagram of a computing system, including at least one memory system, in accordance with one or more embodiments.

FIG. 1C is a functional block diagram of the codeword user system 100B, including at least one memory system 102, in accordance with one or more embodiments of the present disclosure. In general, the codeword user system 100B can include a host system 112 that uses the memory system 102. For example, the host system 112 can write data to the memory system 102 and read data from the memory system 112.

In the embodiment illustrated in FIG. 1C, the memory system 102 includes a controller 104 and one or more memory devices $106_1$-$106_R$, which may correspond to separate memory channels. In this example, the controller 104 is external to the one or more memory devices $106_1$-$106_R$. The memory devices $106_1$-$106_R$ can provide storage for the memory system 102 and/or the computing system 100 (e.g., the memory devices $106_1$-$106_R$ may be formatted with a particular file system for use by the computing system 100). The controller 104 includes control circuitry (e.g., hardware, firmware, and/or software) for controlling/managing the memory devices $106_1$-$106_R$. In one or more embodiments, the controller 104 is an application specific integrated circuit (ASIC) coupled to a printed circuit board, including a physical interface to the memory devices $106_1$-$106_R$. The controller 104 can utilize one or more processors 108B and/or local memory/storage 110B for use in controlling/managing the memory devices $106_1$-$106_R$. The processor 108B can be a central processing unit, microprocessor, integrated circuit, field programmable gate array, or other circuitry to read, write, and may maintain memory content as well as perform the embodiments set forth in this document.

The codeword user system 100B can be a computing device such as a desktop computer, laptop computer, network server, mobile device, a memory card reader, or an interface hub, among other host systems, and can include a memory access device (e.g., one processor (processing device) or multiple processors configured in a parallel processing system or as coprocessors). For example, in one embodiment, the codeword user system 100B is a personal computer and the host system 112 comprises a central processing unit that carries out the instructions of a computer program by performing the basic arithmetic, logical, control and input/output (I/O) operations specified by the instructions. One or more of these instructions may include or require access (e.g., read or write access) to user data stored in the memory devices $106_1$-$106_R$. Accordingly, the host system 112 may request access to the memory devices $106_1$-$106_R$ via commands or instructions passed to the controller 104 via the host interface 114.

The memory system 102 can include volatile memory devices, non-volatile memory devices, or a combination of volatile and non-volatile memory devices. The memory system 102 can be a storage system (e.g., solid-state drive (SSD)) to be used for data storage in the computing system 100. As a storage system, the memory system 102 can include memory devices $106_1$-$106_R$ that are non-volatile memory devices. For example, the memory devices $106_1$-$106_R$ may be a negative-and (NAND) type flash memory. Each of the memory devices $106_1$-$106_R$ can include one or more arrays of memory cells such as single level cells (SLCs), multi-level cells (MLCs), or quad-level cells (QLCs). Each of the memory cells can store bits of data (e.g., data blocks) used by the host system 112. Although non-volatile memory devices, such as NAND type flash memory, are described, the memory devices $106_1$-$106_R$ can be based on any other type of memory. For example, the memory devices $106_1$-$106_R$ can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, and electrically erasable programmable read-only memory (EEPROM).

In one embodiment, memory devices 112A-112N are a cross-point array of non-volatile memory cells. Cross-point non-volatile memory can perform bit storage based on a change of bulk resistance, in conjunction with a stackable cross-gridded data access array. Additionally, cross point non-volatile memory can perform a write in-place operation (in contrast to many Flash-based memory), where a non-volatile memory cell may be programmed without the non-volatile memory cell being previously erased.

The host system 112 can be coupled to the memory system 102 via a host interface 114. In one or more embodiments, the host interface 114 is a standardized physical interface. For example, when the memory system 102 is used for data storage in the computing system 100, the host interface 114 may be a serial advanced technology attachment (SATA) interface, a peripheral component interconnect express (PCIe) interface, or a universal serial bus (USB) interface, Fibre Channel, Serial Attached Small Computer System Interface (SCSI) (SAS), among other standardized connectors and interfaces. The host system 112 can further utilize an Non-Volatile Memory (NVM) Express (NVMe) interface to access the memory devices $106_1$-$106_R$ when the memory system 102 is coupled with the host system 112 by the PCIe interface. In some embodiments, the memory system 102 is a hybrid memory/storage system.

The host interface 114 can provide an interface for passing control, address, data, and other signals between the memory system 102 and the host system 112. In general, however, the host interface 114 can be comprised of any set of circuitry and protocols that provide an interface for passing control, address, data, and other signals between the memory system 102 and the host system 112.

The controller 104 can communicate with the memory devices $106_1$-$106_R$ to read or write user data, among other operations. The controller 104 can have circuitry that includes one or more integrated circuits, discrete components, and/or code/instructions for managing/controlling the memory devices $106_1$-$106_R$. For example, the local memory/storage 110 can include a codeword manager 116. As shown in FIG. 1C, the codeword manager 116 includes an encoding system 116A, an inverting system 116B, and a decoding system 116C. As will be described in greater detail below, the encoding system 116A encodes user data received from a host system 112 based on the BCH codeword templates provided by the codeword template system 100A to produce corresponding invertible, shortened BCH codewords; the inverting system 116B inverts shortened BCH codewords; and the decoding system 116C decodes invertible, shortened BCH codewords (from either an inverted or normal state) to produce the original user data.

The controller 104 couples to a connection/interface of each memory device $106_1$-$106_R$ to receive or transmit the appropriate signal at the appropriate time to carry out an operation (e.g., reading or writing user data). In some embodiments, the communication protocol between the host system 112 and the memory system 102 is different than the protocol used by the controller 104 for access of a memory device $106_1$-$106_R$. In these embodiments, the controller 104 translates the commands/signals received from the host system 112 into the appropriate commands/signals to achieve the desired access to a memory device $106_1$-$106_R$.

Each memory device $106_1$-$106_R$ can include one or more arrays of memory cells (e.g., non-volatile memory cells). The memory devices $106_1$-$106_R$ may each include a number of memory cells that can be grouped. As used herein, a group can include one or more memory cells, such as a page, block, plane, die, an entire array, or other groups of memory cells. For example, some memory arrays can include a number of pages of memory cells that make up a block of memory cells. A number of blocks can be included in a plane of memory cells. A number of planes of memory cells can be included on a die. As an example, a 128 GB memory device can include 4314 bytes of data per page, 128 pages per block, 2048 blocks per plane, and 16 planes per device. Sets of memory cells in a memory device $106_1$-$106_R$ may be referenced using an assigned address. In particular, an address may be assigned to one or more memory cells in a memory device $106_1$-$106_R$ such that the address may be used for accessing the corresponding memory cells (e.g., reading the one or more memory cells or writing to the one or more memory cells).

A group of memory cells in a memory device $106_1$-$106_R$ may be used for storing user data (e.g., codewords). For example, each memory cell in a memory device $106_1$-$106_R$ may be used for storing a single bit of user data. In some embodiments, the user data stored in the memory devices $106_1$-$106_R$ may include or may be stored along with parity bits that are used to correct for errors introduced while the user data is stored in the memory devices $106_1$-$106_R$. For example, the errors may be caused by the noise experienced by the memory devices $106_1$-$106_R$ (e.g., electromagnetic radiation), which causes bits to be flipped in the memory devices $106_1$-$106_R$. In some embodiments, the user data may also be stored along with one or more inversion bits that indicate whether the codeword storing the user data has been inverted after being encoded. As will be described below, inversion of codewords (i.e., inversion/complimenting each bit of a codeword) may reduce imprint effects caused by memory cells maintaining a single state for an extended period of time (i.e., remaining set or unset for an extended period of time).

In one embodiment, the memory devices $106_1$-$106_R$ may store data using Bose-Chaudhuri-Hocquenghem (BCH) codewords. Given a prime power q, a BCH codeword is a linear block codeword over a Galois Field (GF) (or a finite field) GF(q) defined by the parity-check matrix whose rows include consecutive powers of an element a that is chosen from a decoder alphabet GF($q^m$). A BCH codeword is cyclic with block length equal to the order of α (i.e., block length equal to $2^m-1$). The generator polynomial of a BCH codeword is the least common multiple (LCM) of the minimal polynomials of the appropriate powers of α.

Figure 2:
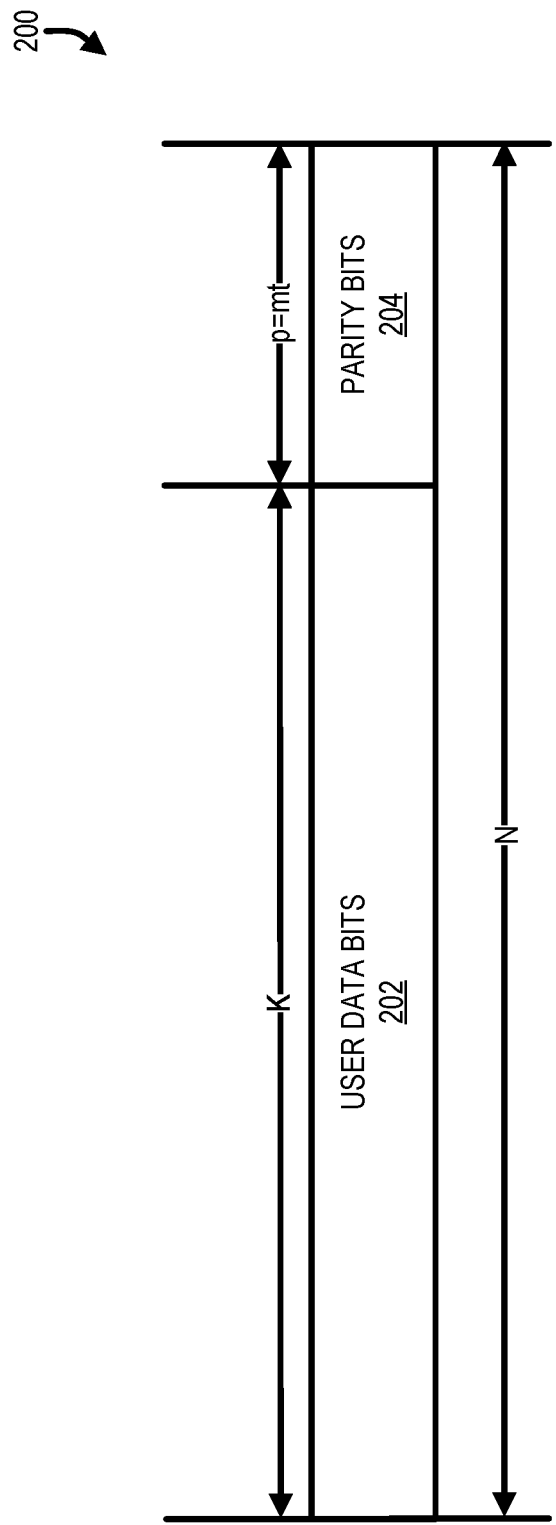
FIG. 2 shows a full-length Bose-Chaudhuri-Hocquenghem (BCH) codeword in accordance with one or more embodiments.

For a binary BCH codeword, (N–K)≤mt. Here, N is the length of the BCH codeword, where N=($2^m-1$), K is the length of the user data bits for the BCH codeword, m is the degree of the Galois Field (e.g., m=$\lfloor \log_2 N \rfloor$), and t is the correction power (i.e., number of bits from the user data bits and/or an inversion bit to be corrected using the parity bits). To correct a single bit error, m parity bits are necessary. Accordingly, to correct for t bit errors, m*t parity bits are necessary (i.e., the number of parity bits p is equal to m*t). A property of BCH codewords is that an inverted full-length BCH codeword is also a valid BCH codeword with the same length N as the original BCH codeword. FIG. 2 shows a full-length BCH codeword 200, according to one embodiment, that includes N bits, of which K bits are user data bits 202 and p bits are parity bits 204, where p=mt. In some embodiments, an inversion bit may be part of the user data bits 202, while in other embodiments an inversion bit is separate from the user bits 202.

Figure 3:
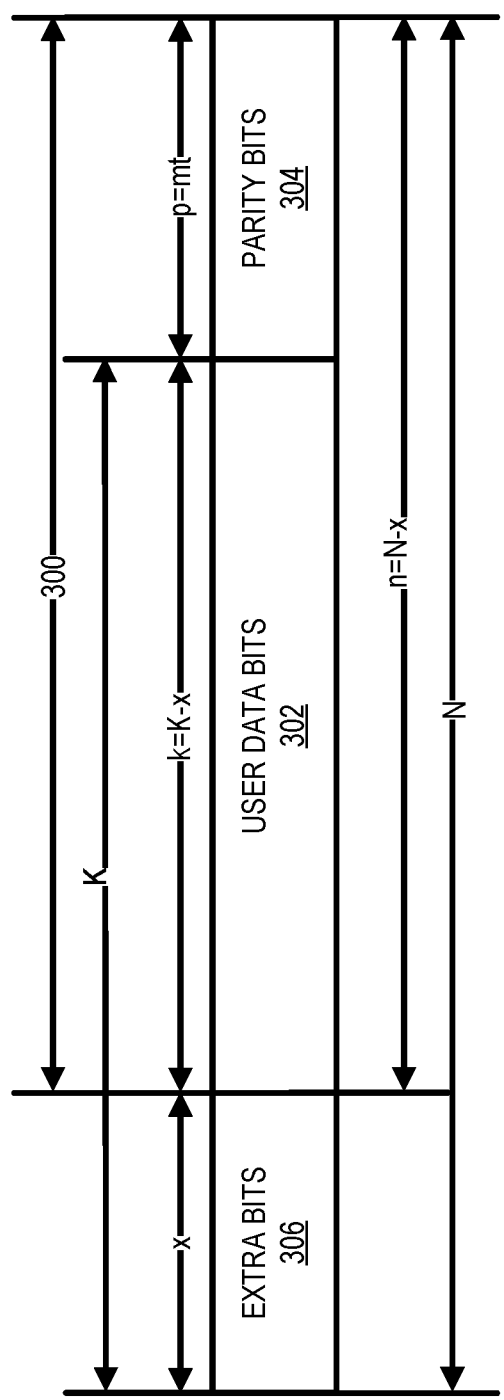
FIG. 3 shows a shortened BCH codeword in accordance with one or more embodiments.

BCH codewords may be relatively long and the user data bit portion of the codeword (e.g., user data bits 202) may be awkwardly provisioned. For example, when the degree of the Galois Field is seven (i.e., m=7), the length of a BCH codeword N is 127 bits (i.e., N=$2^m-1$=$2^7-1$=128-1=127). Assuming two-bit errors of the codeword are desired to be corrected in the user data bit portion of the codeword (e.g., t=2), the number of parity bits p is equal to fourteen bits (i.e., mt=7*2=14) and the user data bit portion of the BCH codeword is limited to 113 bits (i.e., N–mt=127-14=113). However, generally user data bit portions are powers of two. Thus, to allow for user data bits that are powers of two (e.g., $2^7$, $2^8$, $2^9$, $2^{10}$, etc.) a large number of bits must go unused in the BCH codeword. For example, in cases where the user data bit portion is selected to be sixty-four bits in length and the parity bits are equal to fourteen bits in length (i.e., mt=7*2=14) while the BCH codeword is 127 bits in length, forty-nine bits will go unused (e.g., 127-64-14=49). As used herein, a BCH codeword that uses a subset or less than all of the bits available (e.g., as provided in the example above where 49 bits of 127 bits were unused) is a shortened BCH codeword while a BCH codeword that uses all available bits (e.g., uses all 127 bits in the example above for the user data bits and the parity bits) is a full-length BCH codeword. A shortened BCH codeword is denoted by (N–x, K–x) or (n,k) where x is the reduction in the BCH codeword length (e.g., x would equal forty-nine in the above example). FIG. 3 shows a shortened BCH codeword 300 according to one embodiment, which includes user data bits 302, parity bits 304, and extra bits 306 (i.e., bits that a BCH decoder will assume are zeros without reading corresponding portions of the shortened BCH codeword).

In the shortened BCH codeword (n,k) 300 of FIG. 3, where n is the length of the shortened BCH codeword 300 (e.g., n<($2^m-1$)) and k is the length of the user data bits 302 of the shortened BCH codeword 300, the k user data bits 302 may include a single inversion bit. The x extra bits 306 are implied zeros (i.e., these x zeros are not written to memory as it is known these x extra bits 306 each have a value of zero). Although the user data bits 302 are described here as including an inversion bit, the inversion bit may be described later as being separate from the user data bits 302 for purposes of explanation and clarity.

Figure 4:
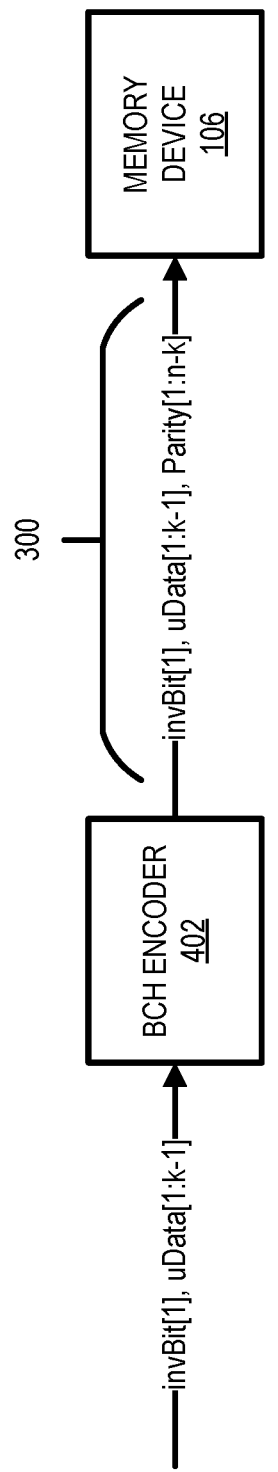
FIG. 4 shows an example of encoding and writing a shortened BCH codeword in accordance with one or more embodiments.

FIG. 4 shows an example of encoding and writing a shortened BCH codeword 300 according to one embodiment. As shown in FIG. 4, the BCH encoder 402, which as described in more detail below is part of the encoding system 116A, takes in the k–1 user data bits (uData) along with the inversion bit (invBit), which was part of the user data bits of FIG. 3, and generates n–k parity bits (Parity) reflective of the k–1 user data bits (uData) and the inversion bit (invBit) of the shortened BCH codeword 300, where n–k=mt=p. The combined inversion bit (invBit), user data bits (uData), and parity bits (Parity) (i.e., the shortened BCH codeword 300) are thereafter written to memory devices $106_1$-$106_R$. The parity bits (Parity) are generated using any cyclic error correction coding scheme, including a BCH scheme.

To avoid potential imprint issues to memory devices $106_1$-$106_R$, the shortened BCH codeword 300 can be inverted/complimented and rewritten to the memory devices $106_1$-$106_R$ such that bits of the shortened BCH codeword 300 are periodically flipped between set and unset and between unset and set (e.g., zeros become ones and ones become zeros). The inversion ensures that any particular memory cell of the memory devices $106_1$-$106_R$ is not persisted in the same state for an extended period of time. For example, after the expiration of a certain period since writing the shortened BCH codeword 300 to the memory devices $106_1$-$106_R$ (e.g., one microsecond), the shortened BCH codeword 300, which may have been altered based on noise encountered while being stored in the memory devices $106_1$-$106_R$, may be inverted. For instance, as shown in FIG. 5A, an inverter 502 may be used for periodically inverting the inversion bit (invBit), the user data bits (uData), and the parity bits (Parity) of the shortened BCH codeword 300 to produce and inverted inversion bit (~invBit), inverted user data bits (~uData), and inverted parity bits (~Parity) according to one embodiment.

Figure 5A:
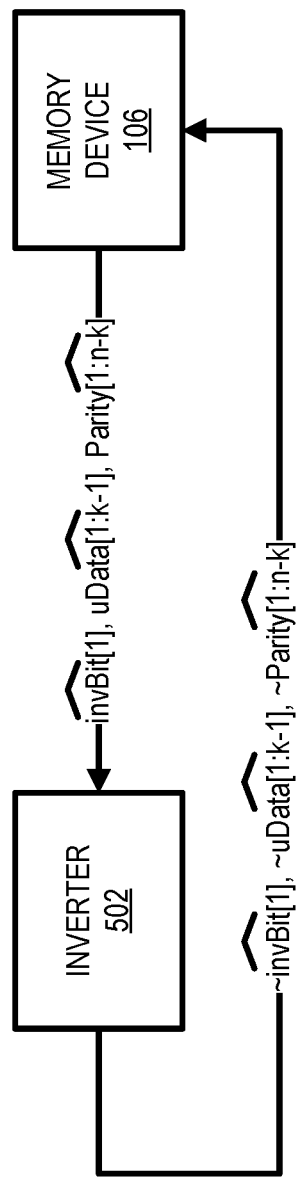
FIG. 5A shows an example of an inverting system in accordance with one or more embodiments.
Figure 5B:
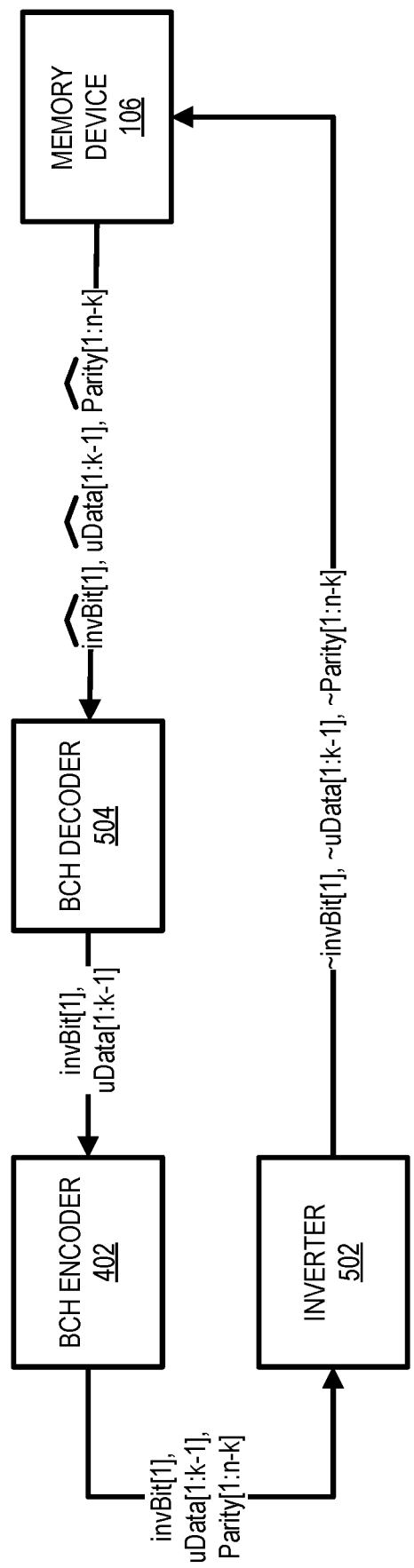
FIG. 5B shows another example of an inverting system in accordance with one or more embodiments.

As denoted in FIG. 5A with use of a hat symbol, the inversion bit (invBit), the user data bits (uData), and the parity bits (Parity) of the shortened BCH codeword 300 may have encountered noise while being stored in the memory devices $106_1$-$106_R$ and this noise may extend to the inverted inversion bit (~invBit), the inverted user data bits (~uData), and the inverted parity bits (~Parity). Before or after one or more inversions by the inverter 502, which as described in more detail below is part of the inverting system 116B, the noisy shortened BCH codeword 300 may have been requested by the host system 112 (e.g., an application of the host system 112 may request the user data bits (uData)). Accordingly, the noisy shortened BCH codeword 300 may be in an inverted or normal state upon request. Since the noisy shortened BCH codeword 300 may be in either an inverted or normal state, a request for the shortened BCH codeword 300 must take this into account such that inverted user data bits (~uData) are not provided to the host system 112. FIG. 5B shows an inverting system according to another embodiment. In the embodiment of FIG. 5B, the noisy inversion bit (invBit), user data bits (uData), and parity bits (Parity) of the shortened BCH codeword 300 are read from the memory devices $106_1$-$106_R$ and fed to the BCH decoder 504 to produce the inversion bit (invBit) and the user data bits (uData) based on the parity bits (Parity). The BCH encoder 402 processes the inversion bit (invBit) and the user data bits (uData) to produce the parity bits (Parity). The inverter 502 inverts the inversion bit (invBit), the user data bits (uData), and the parity bits (Parity) for writing back to the memory devices $106_1$-$106_R$. In this fashion, the inversion bit (invBit), the user data bits (uData), and the parity bits (Parity) are known to be correct data. Although either of the embodiments of FIG. 5A and FIG. 5B may be used, the embodiment of FIG. 5A will be used hereinafter for purposes of explanation.

Figure 6:
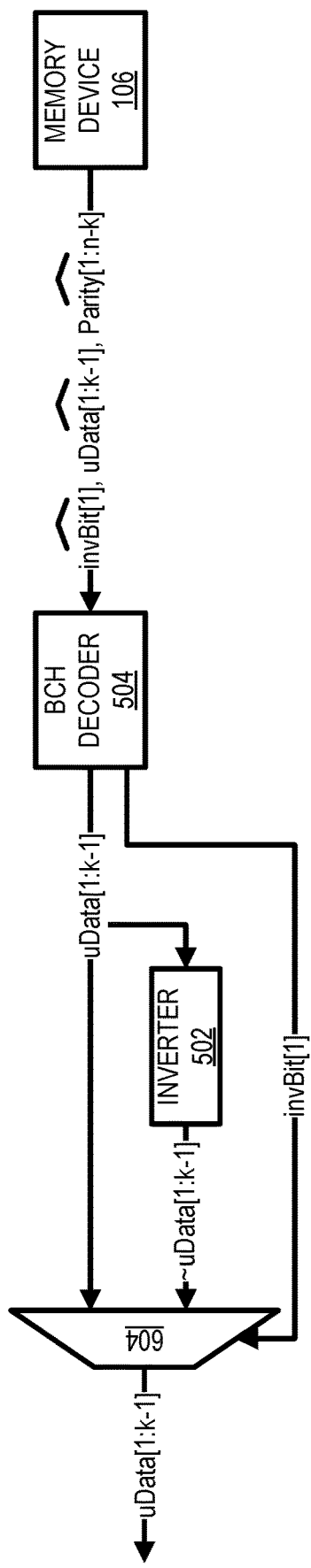
FIG. 6 shows an example of how a noisy shortened BCH codeword may be decoded to fulfill a request from a host system in accordance with one or more embodiments.

FIG. 6 shows an example of how the noisy shortened BCH codeword 300 may be decoded to fulfill a request from the host system 112 according to one embodiment. As shown in FIG. 6, the BCH decoder 504, which as described in more detail below is part of the decoding system 116C, decodes the noisy inversion bit (invBit) and user data bits (uData) of the shortened BCH codeword 300 retrieved from memory device $106_1$-$106_R$ based on the parity bits (Parity) to correct for any noise induced errors. The user data bits (uData) may be fed to a multiplexer 604 along with an inverted version of the user data bits (~uData) from the inverter 502. The inversion bit (invBit) received from the BCH decoder 504 may cause the multiplexer 604 to output the inverted user data bits (~uData) when the inversion bit (invBit) indicates that the user data bits were stored in memory device $106_1$-$106_R$ in an inverted state (i.e., the inversion bit (invBit) is set) and output the user data bits (uData) directly received from the BCH decoder 504 when the inversion bit (invBit) indicates that the user data bits were stored in the memory device $106_1$-$106_R$ in a normal state (i.e., the inversion bit (invBit) is unset).

The decoding shown in FIG. 6 assumes that a shortened BCH codeword 300 is still a valid BCH codeword even when inverted. In particular, since the shortened BCH codeword 300 may be stored in either an inverted or normal state in a memory device $106_1$-$106_R$, the BCH decoder 504 shown in FIG. 6 may be required to decode an inverted version of the shortened BCH codeword 300. If the inverted shortened BCH codeword 300 is not a valid BCH codeword, the BCH decoder 504 will not be able to decode the codeword to produce the user data bits (uData) or may produce an inaccurate result (i.e., a mis-correction). Accordingly, it is important to select only shortened BCH codewords that are also valid BCH codewords when inverted.

As noted above, BCH codewords are linear. Since BCH codewords are linear, taking the exclusive or (XOR) of two valid BCH codewords produces a valid BCH codeword. For example, assuming that the eight-bit string [1111 1111] is a valid BCH codeword, taking the exclusive or of that valid BCH codeword with itself (e.g., [1111 1111] XOR [1111 1111]) necessarily also produces a valid BCH codeword (i.e., [0000 0000]), which is also the inverted state of the original BCH codeword [1111 1111]. Thus, the inversion of a BCH codeword of all ones will also produce a valid BCH codeword.

A BCH codeword may be comprised of user data bits (uData), including an inversion bit, and parity bits (Parity). Although the user data bits (uData) of a shortened BCH codeword 300 may be selected to include only ones, the parity bits (Parity) of the shortened BCH codeword 300 cannot be selected and is constrained by the coding scheme that is used to generate the parity bits (Parity). In particular, although the user data bits (uData) may be selected to include only ones, the parity bits (Parity) may include some number of zeros and ones (these zeros are in addition to the extra bits 306 that are described as being all zeros or going unused). Accordingly, a method must be used to ensure that both the user data bits (uData) of the shortened BCH codeword 300 and the parity bits (Parity) of the shortened BCH codeword 300 combine to contain n ones, which is the size of the shortened BCH codeword 300 as shown in FIG. 3.

Figure 7A:
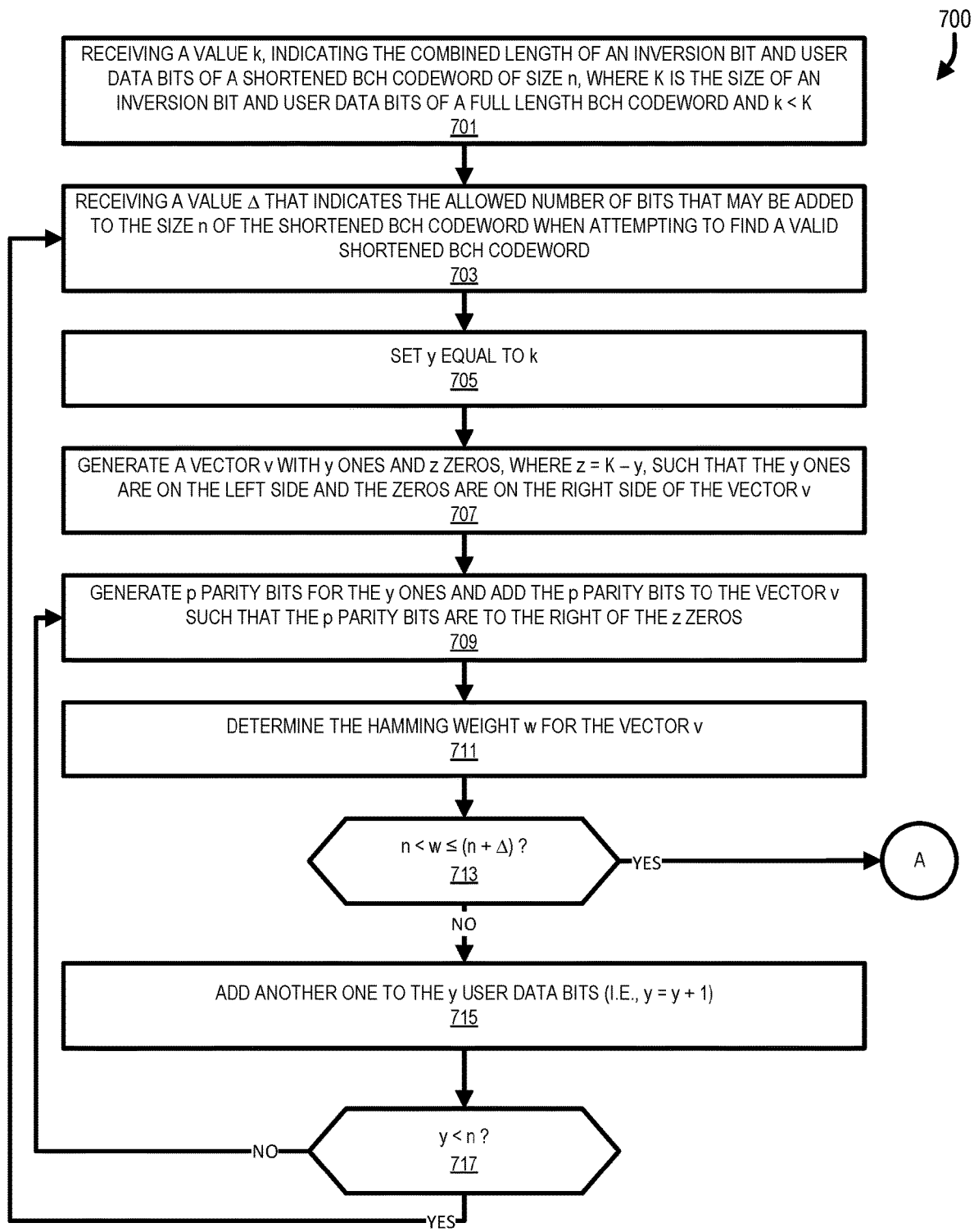
FIGS. 7A and 7B show an example of a method for determining a BCH codeword template for a shortened BCH codeword in accordance with one or more embodiments.
Figure 7B:
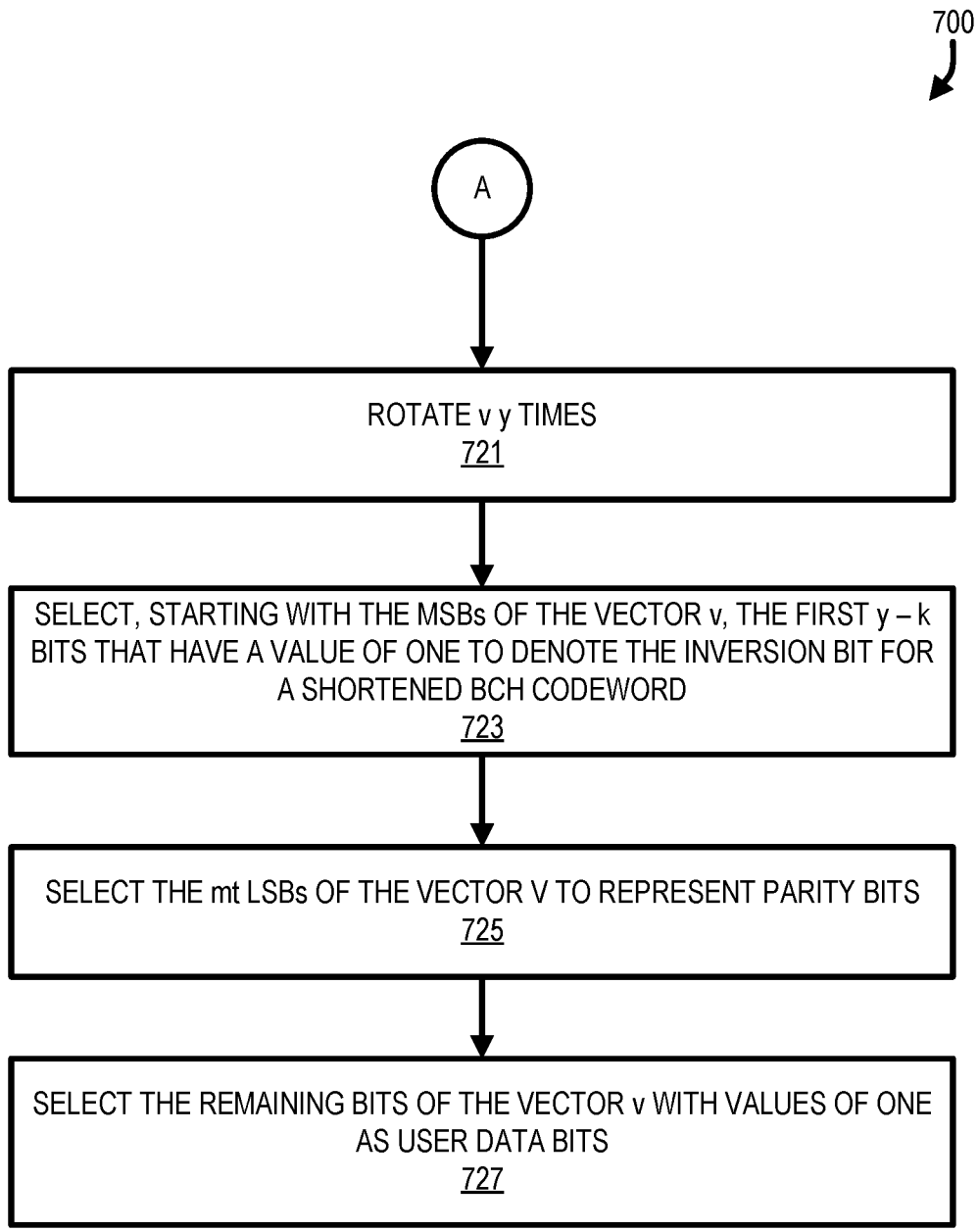

FIGS. 7A and 7B shows an example of a method 700 for determining a BCH codeword template for a shortened BCH codeword 300, in accordance with some embodiments of the present disclosure. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by the codeword template generator 118 of the codeword template system 100A shown in FIGS. 1A-1C. The method 700 can be used initially to generate a BCH codeword template that is provided to one or more user systems (e.g., the codeword user system 100B). Thereafter, the one or more user systems can use the BCH codeword template to generate shortened BCH codewords for managing stored data in the memory devices $106_1$-$106_R$.

The BCH codeword template for a shortened BCH codeword 300 indicates the placement of an inversion bit (invBit), user data bits (uData), and parity bits (Parity) for generating a shortened BCH codeword 300 that when inverted is still a valid BCH codeword. Accordingly, the template indicates the placement of bits when the template is employed to store user data bits (uData) received from a host system 110.

The method 700 commences at operation 701 with the codeword template generator 118 receiving a length k, which indicates the number of bits in a shortened BCH codeword of length n devoted to the inversion bit (invBit) and the user data bits (uData). The n bits of the shortened BCH codeword may include p parity bits, where, as noted above, p is equal to the product of the degree of the Galois Field (i.e., m where $GF(q^m)$) and the number of correction bits (i.e., t correction bits). In this case, the length k may be set based on the selection of the number correction bits t, the degree of the Galois Field m, and the size of the shortened BCH codeword n. Namely, k may be equal to n−p, where p=m*t. The shortened BCH codeword of length n may be less than the length of a full-length BCH codeword of length N as shown in FIG. 3, which has a combined inversion bit (invBit) and user data bits (uData) portion of length K. For purposes of explanation, k is set equal to sixteen at operation 701.

At operation 703, the codeword template generator 118 receives a value Δ that indicates the maximum number of bits that may be added, if necessary, to the length of the shortened BCH codeword to allow the shortened BCH codeword to still be a valid BCH codeword when inverted. For example, as noted above, the shortened BCH codeword is intended to be of n bits in length. However, the method of FIGS. 7A and 7B will allow the shortened BCH codeword to be up to n+Δ in length if necessary. Δ may be set to ensure that the BCH codeword is not getting too large and the benefit of using a shortened BCH codeword is thereby reduced. In some embodiments, Δ can be set based on characteristics of the media being written (e.g., the memory devices $106_1$-$106_R$). For example, a user/designer/administrator of the memory devices $106_1$-$106_R$ can indicate that two bits may be added to a codeword template (i.e., Δ=2). These two bits may be taken from metadata or other data stored in the memory devices $106_1$-$106_R$. As will be described later, if a codeword template cannot be determined using the method 700 when Δ=2, the user/designer/administrator may decide to increase the value of Δ. However, these additional bits must be taken from some portion of the memory devices $106_1$-$106_R$ already devoted to storing data (e.g., metadata stored in the memory devices $106_1$-$106_R$).

Further, Δ may be set equal to any integer value (e.g., one, two, three, etc.). For purposes of explanation, Δ is set equal to two at operation 703. In one embodiment, the values k and Δ may be set by a user/administrator of the computing system 100. Accordingly, the codeword template generator 118 receives the values k and Δ at operations 701 and 703, respectively, from or based on inputs from the user/administrator of the computing system 100.

At operation 705, the codeword template generator 118 sets variable y equal to the value k, which, as noted above, is the length of the combined inversion bit (invBit) and user data bits (uData) portion of the shortened BCH codeword. For example, when the length/size of the combined inversion bit (invBit) and user data bits (uData) portion of the shortened BCH codeword is set to sixteen bits (i.e., k=16), y is set equal to sixteen at operation 705. As will be described below, the value of y may be incremented to allow for the addition of more ones to the combined inversion bit (invBit) and user data bits (uData) portion of the shortened BCH codeword. However, the variable y may be incremented no more than Δ times (i.e., y≤k+Δ). As noted above, k is set equal to sixteen for purposes of explanation at operation 701. Thus, based on this value of k, y may be set equal to sixteen at operation 705.

Figure 8:
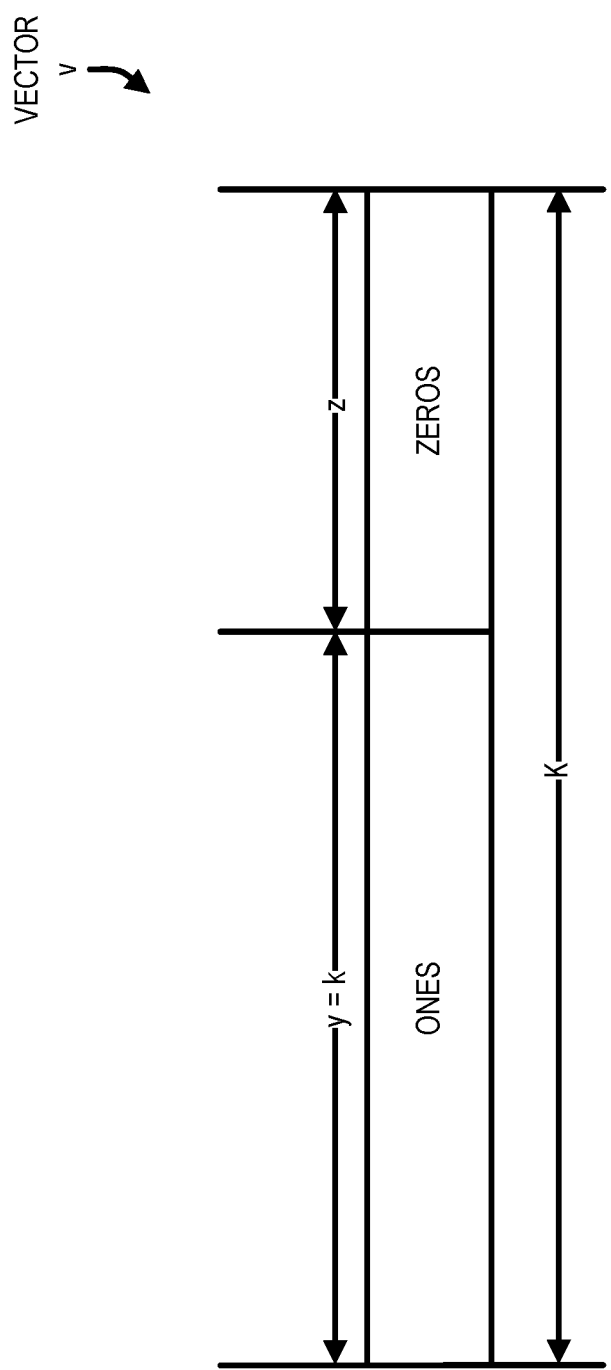
FIG. 8 shows an example of a vector v with a set of continuous ones and a set of continuous zeros in accordance with one or more embodiments.
Figure 9:
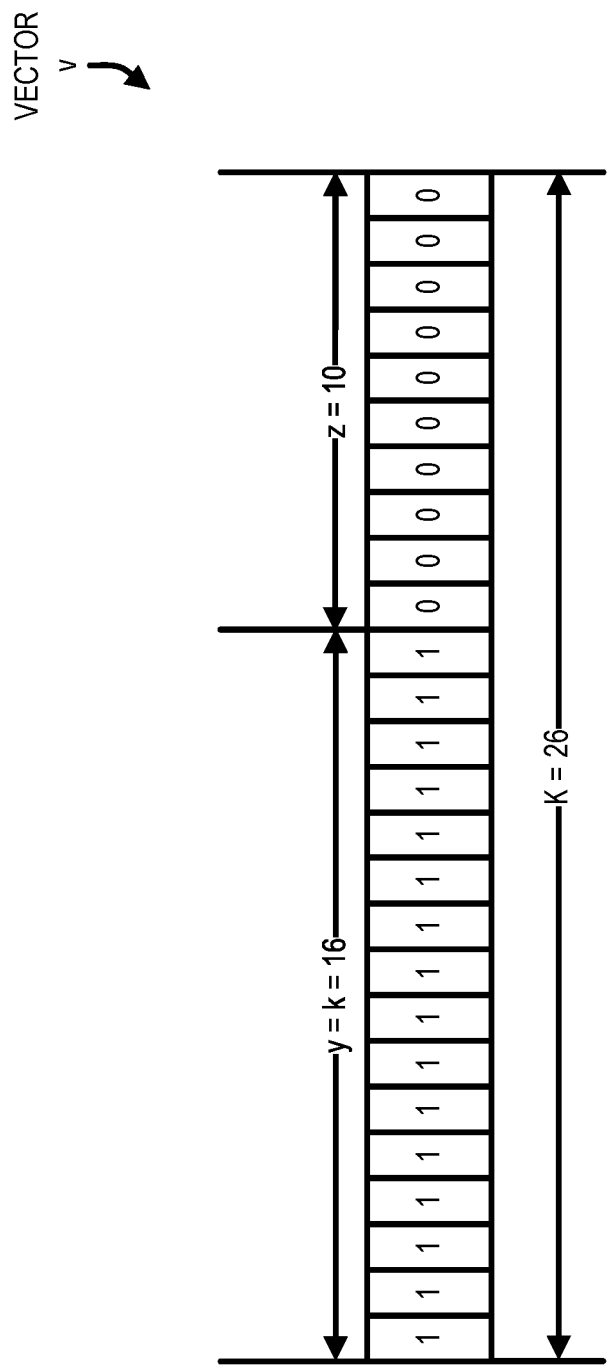
FIG. 9 shows the vector v with a set of example bit values in accordance with one or more embodiments.

At operation 707, the codeword template generator 118 generates a vector v that includes y ones and z zeros, where z is equal to the difference between the length K for a full-length BCH codeword and they number of ones (i.e., z=K−y). As shown in FIG. 8, the y ones may be written to the left most side of the vector v and the z zeros may be written to the right most side of the vector v. FIG. 9 shows an example vector v according to one embodiment. In the example of FIG. 9, the length of a full-length BCH codeword may be thirty-one bits (i.e., m=5 such that N=$2^5$−1=31) and the combined inversion bit (invBit) and user data bits (uData) portion of the full-length BCH codeword may be twenty-six bits (i.e., K=26). As noted above, the BCH codeword template that will be generated based on the vector v of FIG. 9 may initially be set with sixteen combined inversion and user data bit (i.e., y=k=16) such that the number of zeros in the vector v is equal to ten (i.e., z=K−y=26−16=10).

Figure 10:
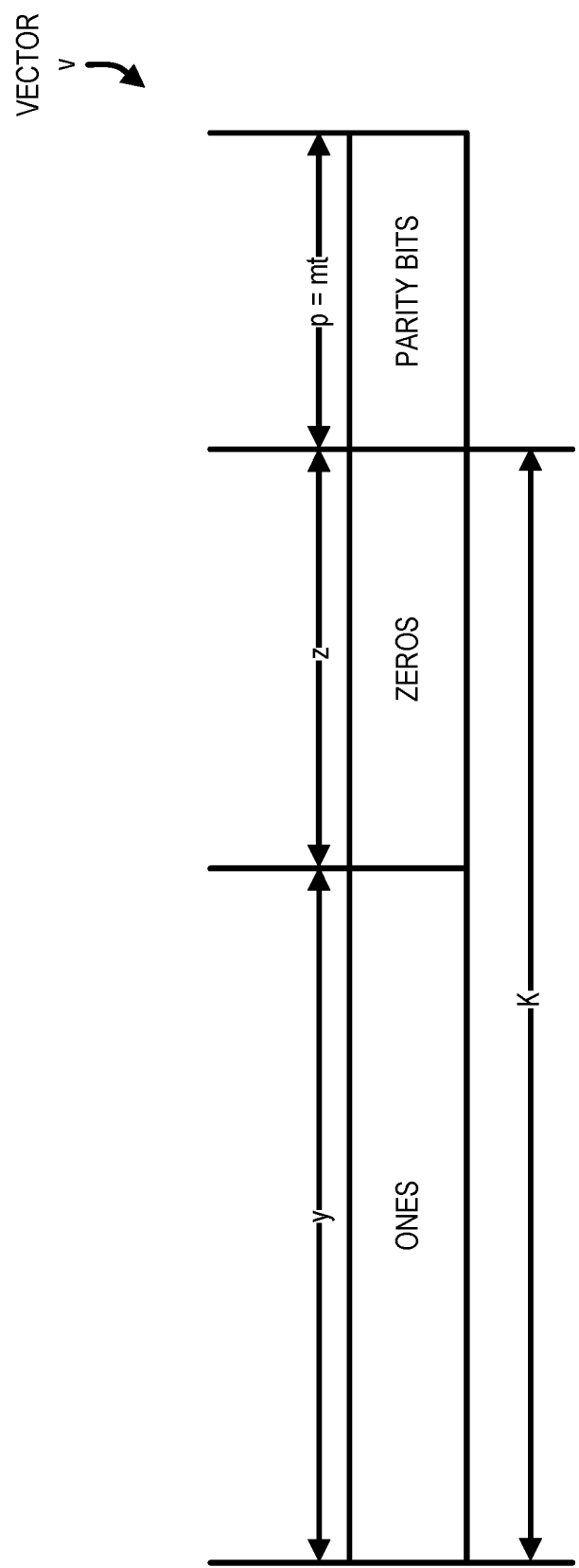
FIG. 10 shows an example vector v with a set of continuous ones, a set of continuous zeros, and a set of parity bits in accordance with one or more embodiments.
Figure 11:
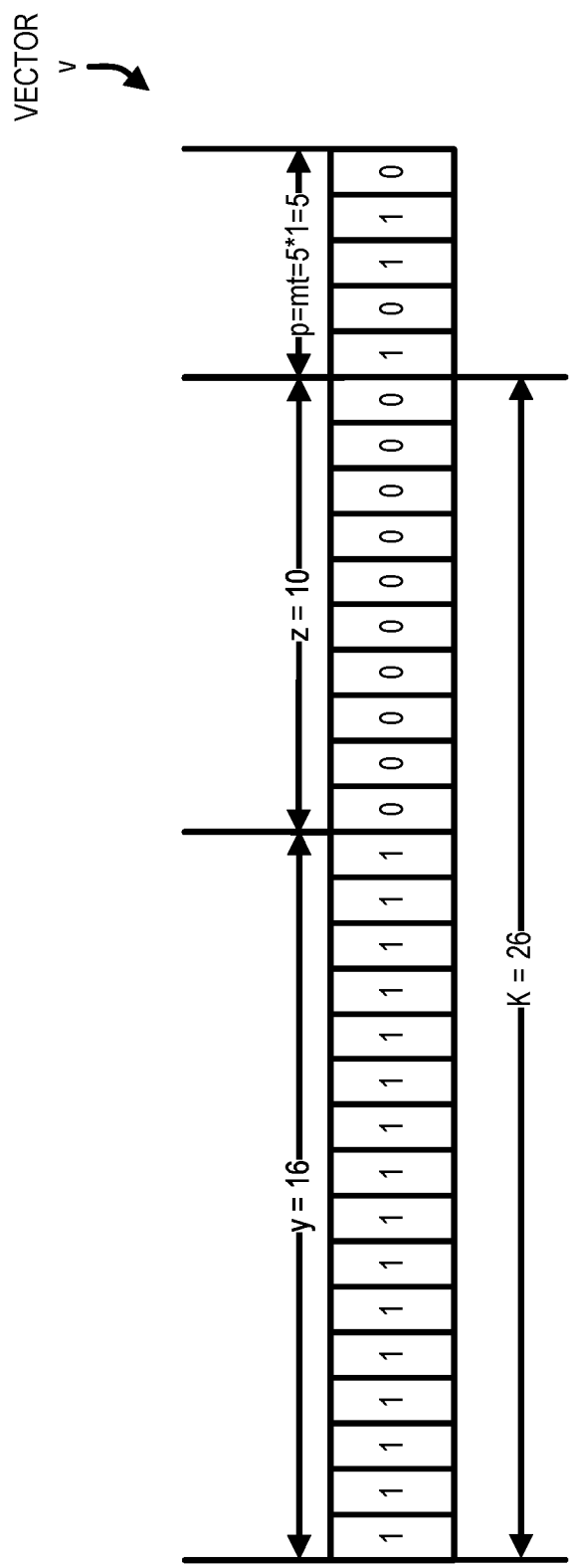
FIG. 11 shows the vector v with a set of example bit values, including an example set of parity bit values in accordance with one or more embodiments.

At operation 709, the codeword template generator 118 generates p parity bits for the vector v. FIG. 10 shows the p parity bits added to the vector v. The number of parity bits p may correspond to the degree of the Galois Field (m) and the correction power (t) for the parity bits (i.e., number of bits to be corrected). In particular, the number of parity bits p may be equal to m*t. In the example provided in FIG. 9, the degree of the Galois Field m may be equal to five and the correction power t may be equal to one such that there are five parity bits (i.e., p=m*t=5*1=5). The p parity bits may have some number of ones and zeros and is dependent on the algorithm/scheme used to calculate the parity bits. To ensure that the combined y and p bits represent a valid shortened BCH codeword, even when inverted, the y and p bits must combine to have n ones. FIG. 11 shows a vector v with the added p parity bits based on the example set of bits of FIG. 9.

At operation 711, the codeword template generator 118 determines the hamming weight w for the vector v (i.e., HW(v)=w). The hamming weight w is equal to the number of ones in the vector v. As shown in FIG. 10, vector v includes y ones, z zeros, and p parity bits (that may be a combination of ones and zeros). Since the vector v is comprised of y ones corresponding to inversion and user data bits (i.e., the y ones collectively represent the user data bits (uData) and the inversion bit (invBit) that as noted above, may be set to all ones for purposes of the template generated by the method 700) and some number of ones in the parity bits, the hamming weight w for the vector v is the sum of y and the number of ones in the p parity bits (i.e., y+ (number of ones in the p parity bits)). For instance, in the example vector v shown in FIG. 11, the hamming weight w is nineteen (i.e., w=HW(v)=y+HW(parity bits)=16+3=19).

At operation 713, the codeword template generator 118 determines if the hamming weight w is greater than n (the original size of the shortened BCH codeword) but less than or equal to n+Δ. In particular, the codeword template generator 118 determines at operation 713 whether the sum of ones in the vector v is greater than the original set length n of the shortened BCH codeword but not larger than the allowed expansion of the shortened BCH codeword n+Δ. In response to determining that n<w≤n+Δ, the codeword template generator 118 indicates that the vector v may be used to produce valid shortened BCH codewords, which when inverted will also represent a valid BCH codeword, and the method 700 may move to operation 721.

In contrast, when the codeword template generator 118 determines at operation 713 that the hamming weight w of the vector v is less than or equal to n, the method 700 may move to operation 715 for the codeword template generator 118 to add another one to the set of y ones (i.e., y=y+1) (i.e., the inversion and user data bit portion of the vector). The addition of another one decrements the number of zeros (i.e., z=z−1) and allows the p parity bits to be generated again with the possibility that more of the p parity bits are equal to one such that the hamming weight w of the vector v may now be potentially greater than n. After adding another one to the number ones in the vector v at operation 715, the codeword template generator 118 determines whether y is less than n at operation 717. In particular, at operation 717 the codeword template generator 118 determines whether the number of bits added to represent the combined inversion bit (invBit) and user data bits (uData) is getting too large (i.e., whether y equals or is greater than the length of the original shortened BCH codeword without considering the additional size added to the codeword by the p parity bits). When y is less than or equal to n, the codeword template generator 118 returns to operation 709 to generate p parity bits. Conversely, when y is greater than n, the codeword template generator 118 moves to operation 703 to increase the value of Δ (e.g., Δ=Δ+1).

Figure 12:
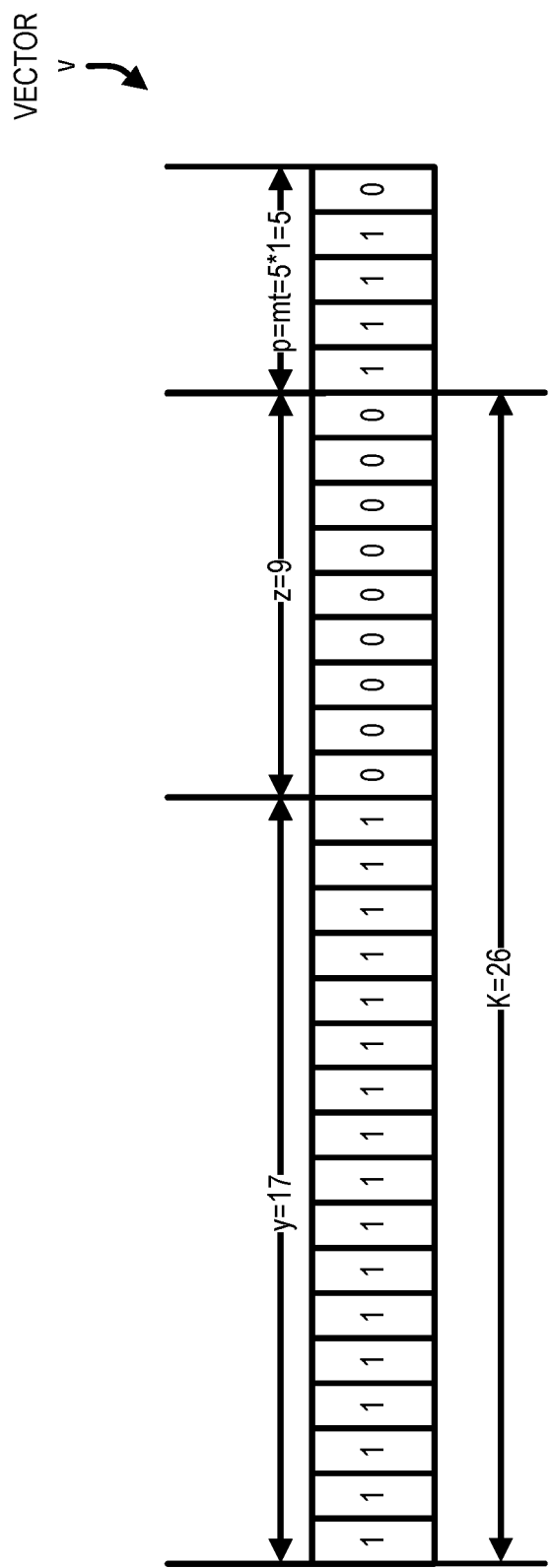
FIG. 12 shows an example vector v that is generated following the addition of another one and the generation of a new set of parity bits in accordance with one or more embodiments.
Figure 13:
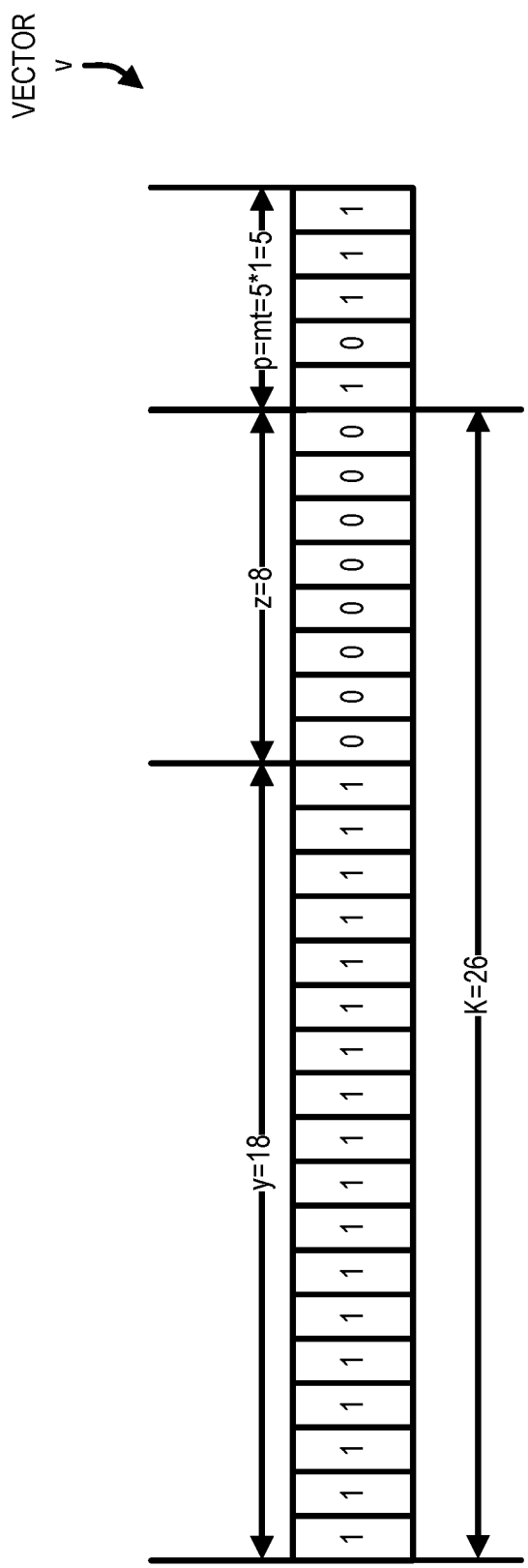
FIG. 13 shows an example vector v that is generated following the addition of another one and the generation of a new set of parity bits in accordance with one or more embodiments.

In the example vector v shown in FIG. 11, the hamming weight w is nineteen, which is less than n since n is equal to twenty-one. Thus, at operation 713 the codeword template generator 118 determines that another one should be added to the y ones since w<n (i.e., 19<21). FIG. 12 shows an example vector v that is generated following the addition of another one (i.e., y=y+1) and the generation of a new set of p parity bits. The vector v in FIG. 12 has a hamming weight w of twenty-one, which still does not fulfill the inequality of operation 713. Thus, the codeword template generator 118 increments y to add another one to the vector v at operation 715. FIG. 13 shows an example vector v that is generated following the addition of another one (i.e., y=y+1) and the generation of a new set of p parity bits. In the example of FIG. 13, the hamming weight w is now twenty-two, which fulfills the inequality of operation 713 (i.e., n=21, w=22, and n+Δ=23 such that n<w≤n+Δ). Accordingly, after fulfilling the inequality of operation 713, the vector v may be used for producing valid shortened BCH codewords, which when inverted will also represent valid BCH codewords, and the method 700 may move to operation 721.

Figure 14:
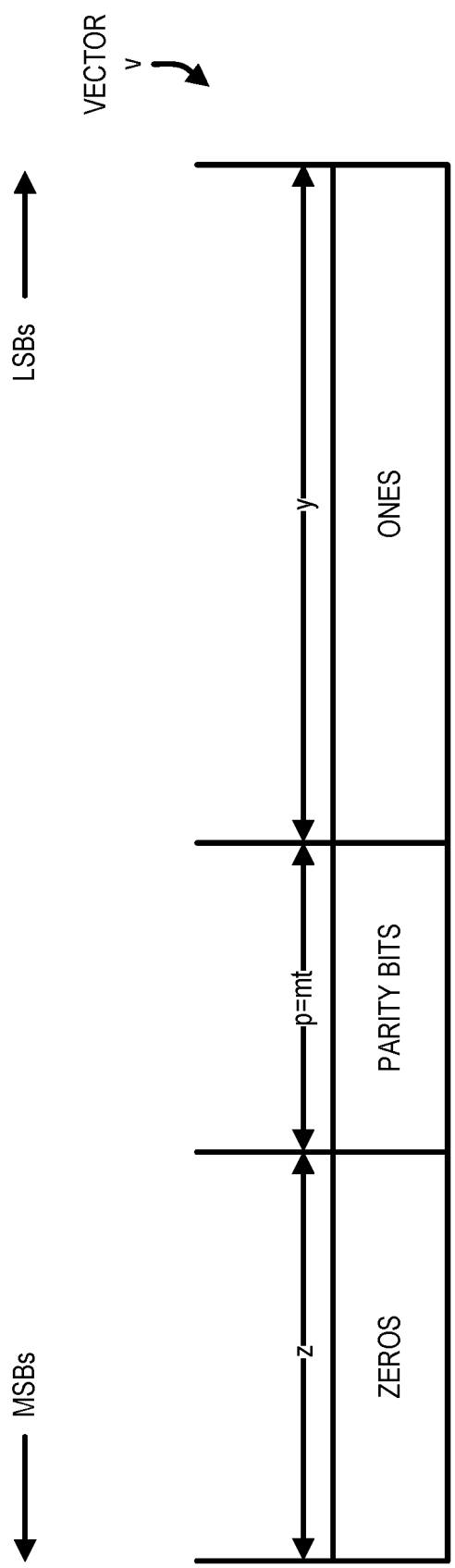
FIG. 14 shows the vector v after rotation such that the vector v is in systematic form in accordance with one or more embodiments.
Figure 15:
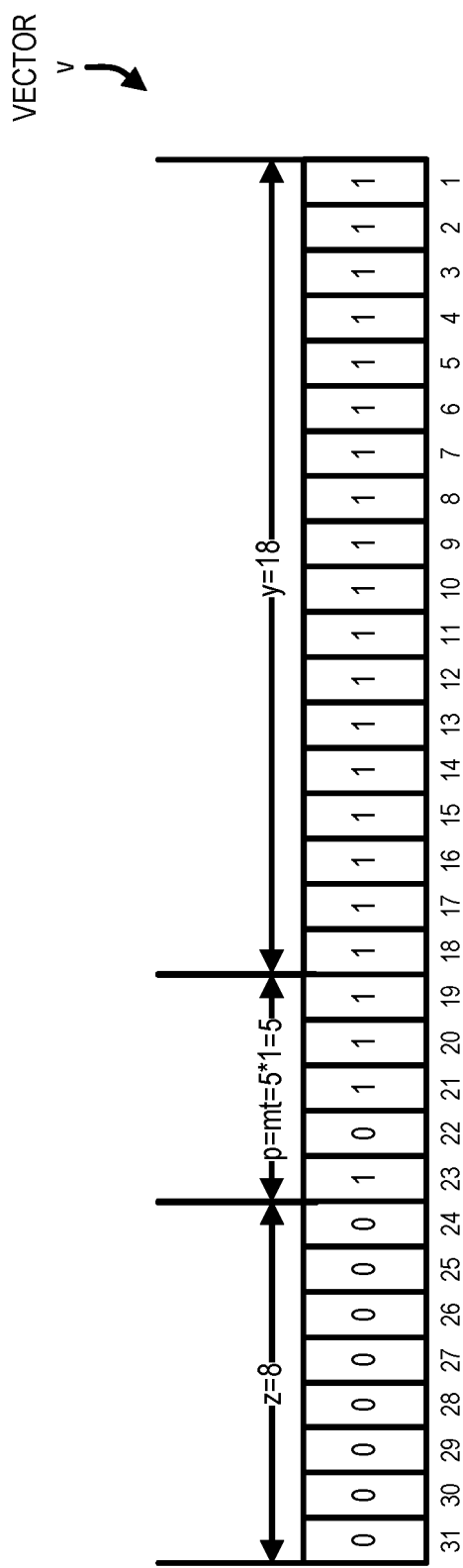
FIG. 15 shows an example vector v after rotation in accordance with one or more embodiments.

At operation 721, the codeword template generator 118 rotates the vector v y times to the left such that the z leading zeros are placed to the left of the vector v as shown in FIG. 14. This rotation places the vector v in proper systematic form (i.e., user data bits and parity bits are separated and/or otherwise distinguishable in the vector v). FIG. 15 shows the vector v from FIG. 13 after the rotation of operation 721. Rotating the vector v by y bits exploits the cyclic property of BCH codewords (i.e., rotating a BCH codeword produces another BCH codeword). Further, this systematic form ensures that the most significant bits (MSBs) of the vector v are on the left side of the vector and the least significant bits (LSBs) are on the right side of the vector as shown in FIG. 14. In this form, the least significant mt bits have all ones and the hamming weight of y+mt is equal to the hamming weight of k+mt+Δ. However, the parity portion of the vector v shown in FIG. 14 includes both ones and zeros.

After rotation of the vector v, the codeword template generator 118 may now begin selecting/mapping bits in the vector v where actual user data bits (uData), an inversion bit (invBit), and parity bits (Parity) will be placed. Accordingly, the original designation of the locations of user data bits (uData), an inversion bit (invBit), and parity bits (Parity) shown in FIG. 15 may be discarded in favor of a selection/mapping of bits for user data bits (uData), an inversion bit (invBit), and parity bits (Parity) that are later received from a host system 112. In particular, the codeword template generator 118 selects the y−k most significant bit positions of the vector v (i.e., starting from the left or MSB side of the vector v shown in FIG. 15) with values of one to represent the inversion bit (invBit) at operation 723. The value y−k represents the number of bits/ones added to the vector v through performance of the operation 715, but not exceeding Δ bits. In the example vector v shown in FIG. 15, since two bits were added to meet the inequality of operation 713, the codeword template generator 118 selects bit positions twenty-three and twenty-one to represent the inversion state/bit at operation 723.

At operation 725, the codeword template generator 118 selects/maps the mt least significant bit positions (i.e., the mt rightmost bits of the vector v shown in FIG. 14) to represent the parity bits (Parity) in the generated template. As noted above, the mt least significant bit positions of the vector v all have a value of one. In the example vector v shown in FIG. 15, since the value of mt is 5 (i.e., p=m*t=5*1=5) the codeword template generator 118 selects/maps bit positions one through five to represent parity bits at operation 725.

Figure 16:
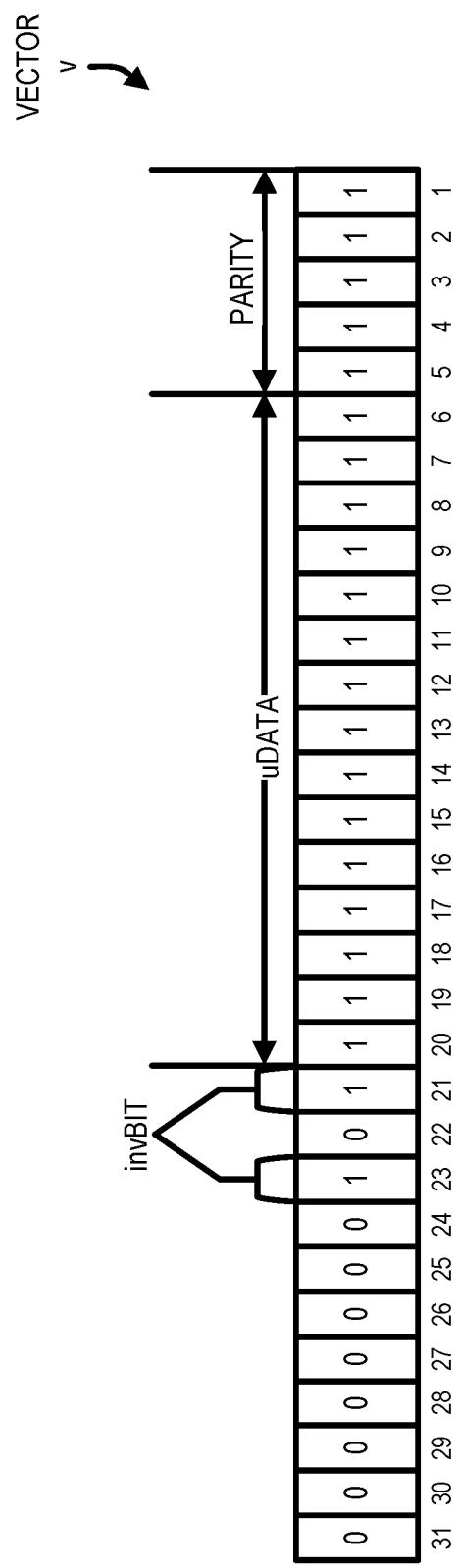
FIG. 16 shows the selection of bits in the vector v to denote an inversion bit, user data bits, and parity bits for BCH codewords in accordance with one or more embodiments.

At operation 727, the codeword template generator 118 selects the remaining/unselected bits in the vector v with values of one for the remaining user data bits (uData). In the example vector v shown in FIG. 15, the codeword template generator 118 selects bits six through twenty for the user data bits (uData). FIG. 16 shows the selection of bits in the vector v per operations 723, 725, and 727. As will be described in further detail below, the bits selected by the codeword template generator 118 represent a BCH codeword template for shortened BCH codewords that when XOR'd with other known valid BCH codewords produces valid BCH codewords.

Figure 17A:
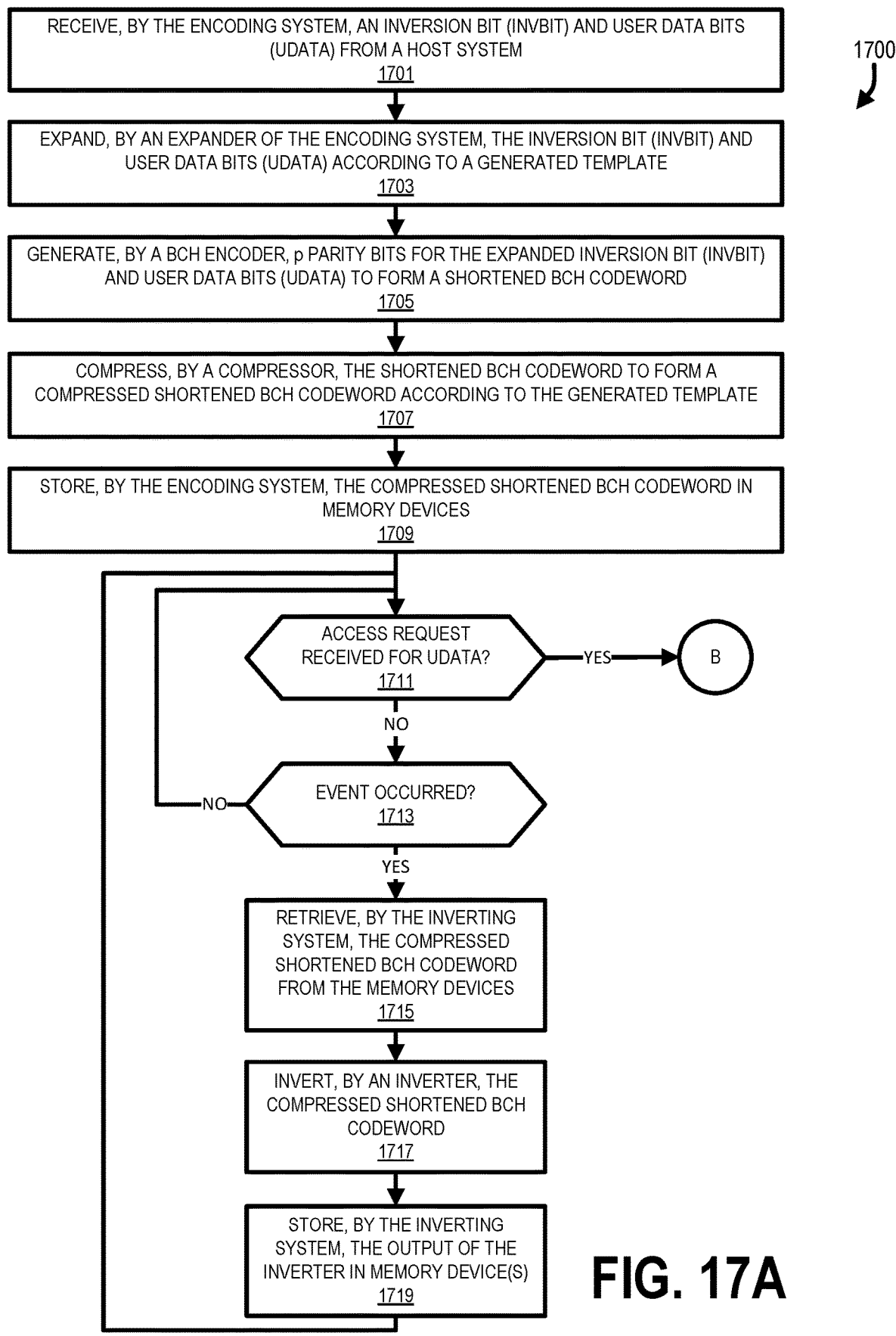
FIGS. 17A and 17B shows a method for using invertible, shortened BCH codewords in accordance with one or more embodiments.
Figure 17B:
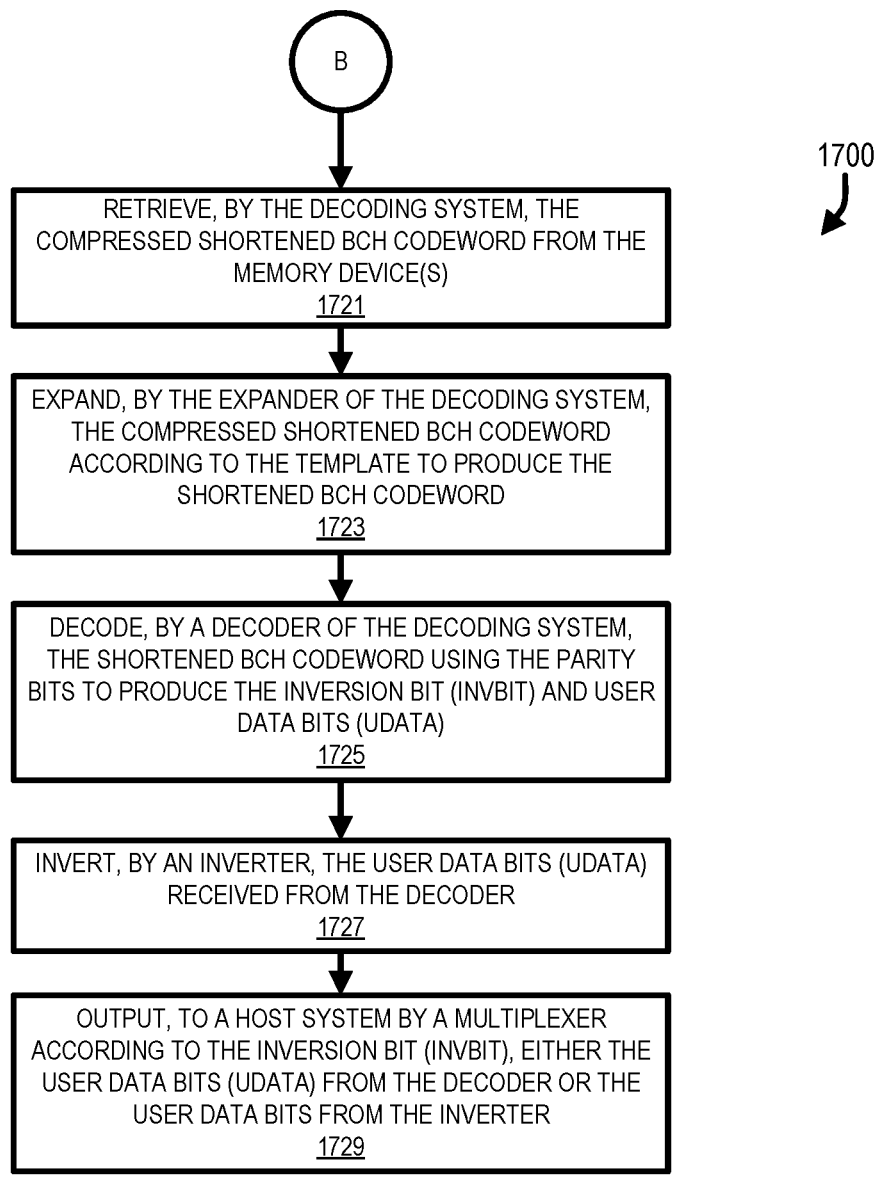

FIGS. 17A and 17B is a flow diagram of an example method 1700 for using invertible, shortened BCH codewords, in accordance with some embodiments of the present disclosure. The method 1700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1700 is performed by the codeword manager 116 of FIG. 1.

In particular, the method 1700 encodes user data bits (uData) received from a host system 112 for storage on memory devices $106_1$-$106_R$ and fulfills requests for the user data bits (uData) using the BCH codeword template generated by the codeword template generator 118 using the method 700. The method 1700 will be described in relation to the example encoding system 116A shown in FIG. 18, the inverting system 116B shown in FIG. 19, and decoding system 116C shown in FIG. 20. As noted above in relation to FIGS. 5A and 5B, in some embodiments the inverting system 116B may include the BCH decoder 504 and the BCH encoder 402 in addition to the inverter 502 to ensure the data being processed (e.g., the inversion bit (invBit), the user data bits (uData), and the parity bits (Parity)) are correct/non-noisy data.

Figure 18:
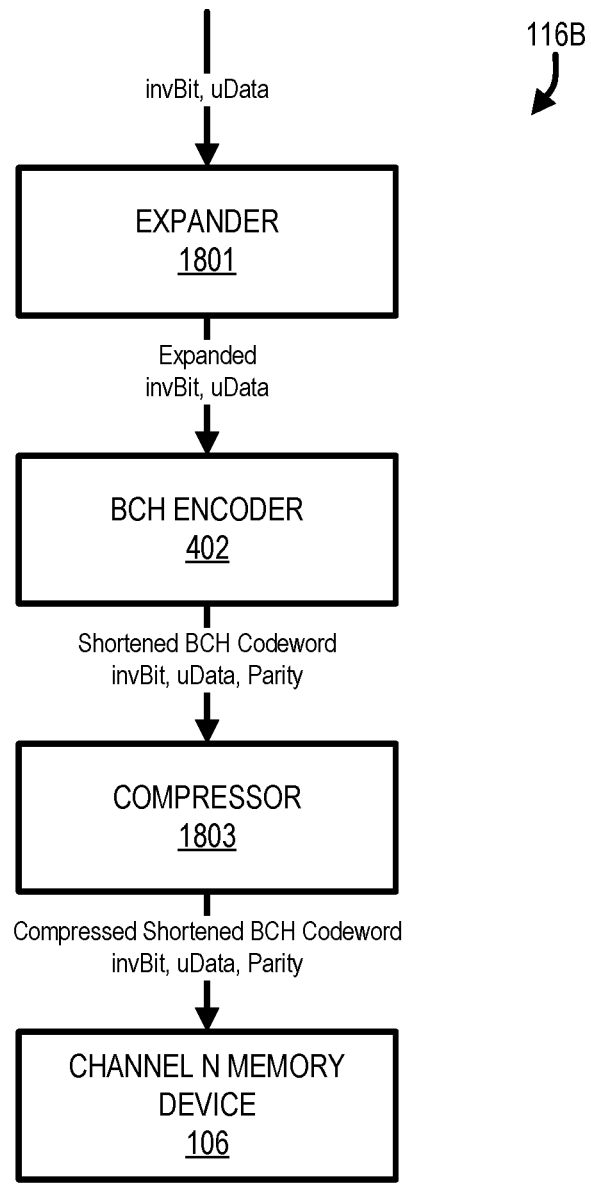
FIG. 18 shows an encoding system in accordance with one or more embodiments.
Figure 19:
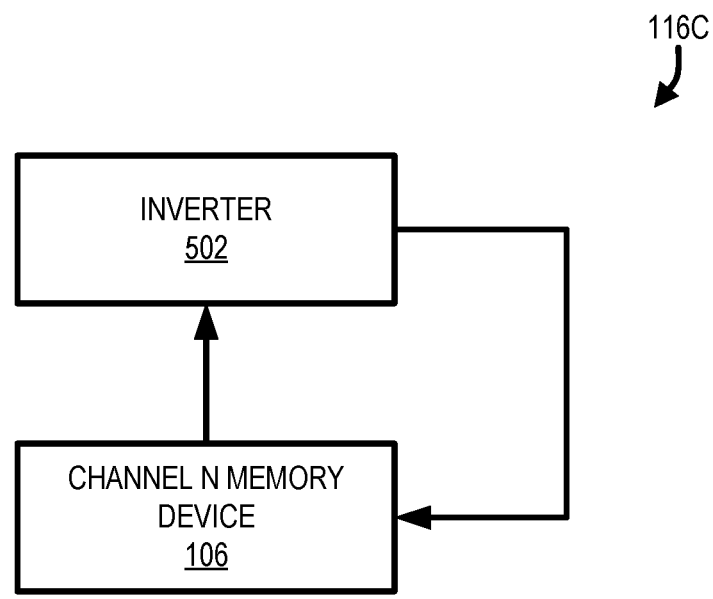
FIG. 19 shows an inverting system in accordance with one or more embodiments.
Figure 21:
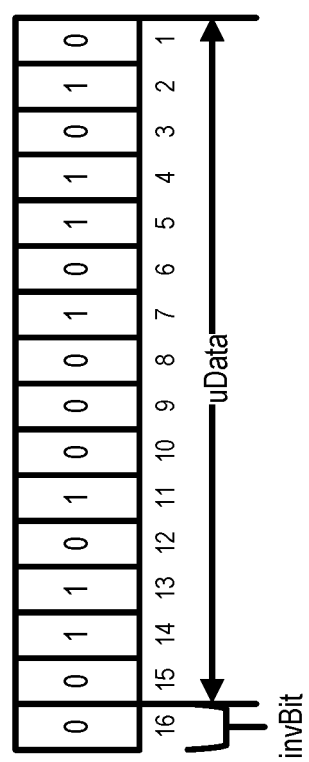
FIG. 21 shows an example inversion bit (invBit) and user data bits (uData) in accordance with one or more embodiments.

In one embodiment, the method 1700 commences at operation 1701 with the encoding system 116A receiving an inversion bit (invBit) and user data bits (uData) as shown in FIG. 18. In particular, an expander 1801 of the encoding system 116A may receive the user data bits (uData) from a host system 112 and the user data bits (uData) may correspond to images, video, audio, text, or any other data for storage on the memory devices $116_1$-$106_R$. The expander 1801 of the encoding system 116A may receive the inversion bit (invBit) from the host system 112 or any other component of the computing system 100. In one embodiment, the expander 1801 may generate/introduce the inversion bit (invBit). Collectively, the inversion bit (invBit) and the user data bits (uData) may include k bits that each may represent a value of zero or one based on the data being represented. Initially, the inversion bit (invBit) may be unset (i.e., the inversion bit (invBit) has a value of zero) as the user data bits (uData) are not inverted (i.e., are in normal form). FIG. 21 shows an example inversion bit (invBit) and user data bits (uData) that will be used hereinafter for purposes of explanation.

Figure 22:
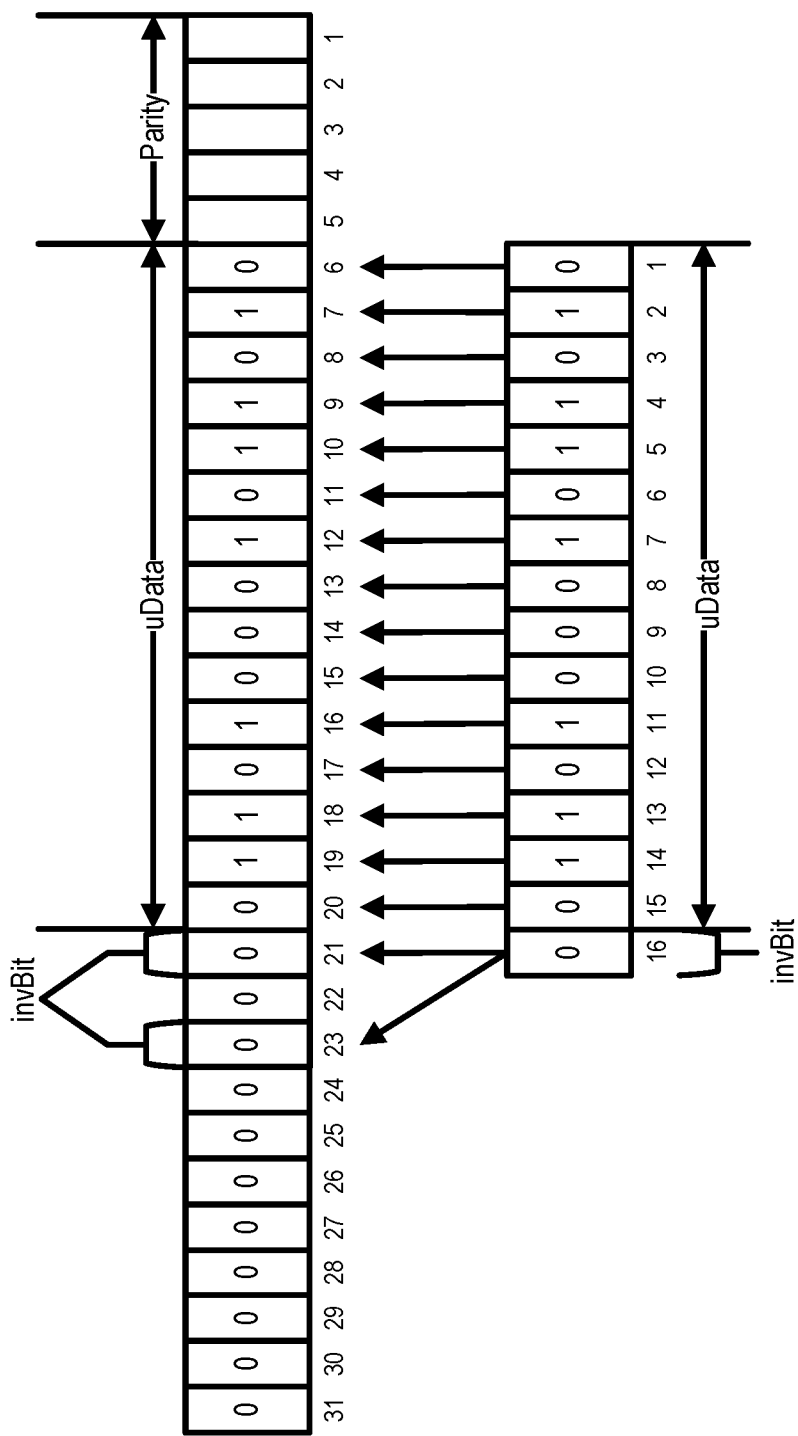
FIG. 22 shows example expanded inversion and user data bits in accordance with one or more embodiments.

At operation 1703, the expander 1801 of the encoding system 116A expands the inversion bit (invBit) and user data bits (uData) according to the BCH codeword template generated by the codeword template generator 118 based on the method 700. In particular, using the example selections of FIG. 16 and the example inversion bit (invBit) and user data bits (uData) of FIG. 21, the expander 1801 may expand/map the inversion bit (invBit) and user data bits (uData) into bit positions of the vector v as shown in FIG. 22. In this example, the inversion bit (invBit) is represented by two bit positions that have identical values (i.e., bit positions twenty-three and twenty-one). Further, the bit positions twenty-three and twenty-one are separated by a bit position twenty-two that is unused. As shown in FIG. 22, the p parity bits (Parity) have not yet been computed.

Figure 23:
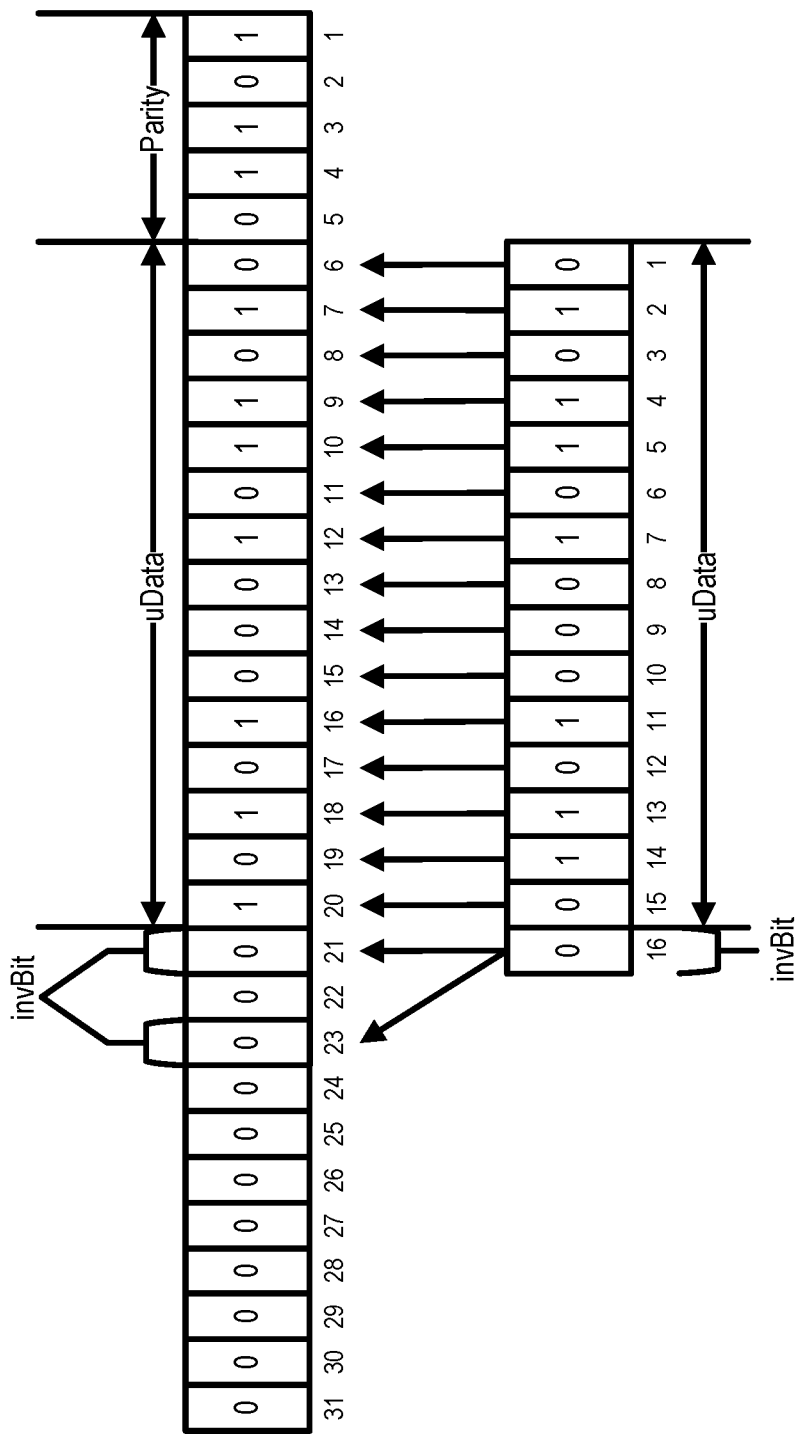
FIG. 23 shows example parity bits generated for the example expanded inversion and user data bits in accordance with one or more embodiments.

At operation 1705, the BCH encoder 402 may generate p parity bits (Parity) for the expanded inversion bit (invBit) and user data bits (uData). The p parity bits (Parity) are generated using any cyclic error correction coding scheme (e.g., a BCH scheme). FIG. 23 shows an example set of p parity bits (Parity) generated by the BCH encoder 402 for the expanded inversion bit (invBit) and user data bits (uData) of FIG. 22. The expanded inversion bit (invBit) and user data bits (uData) together with the p parity bits (Parity) form the shortened BCH codeword.

Figure 24:
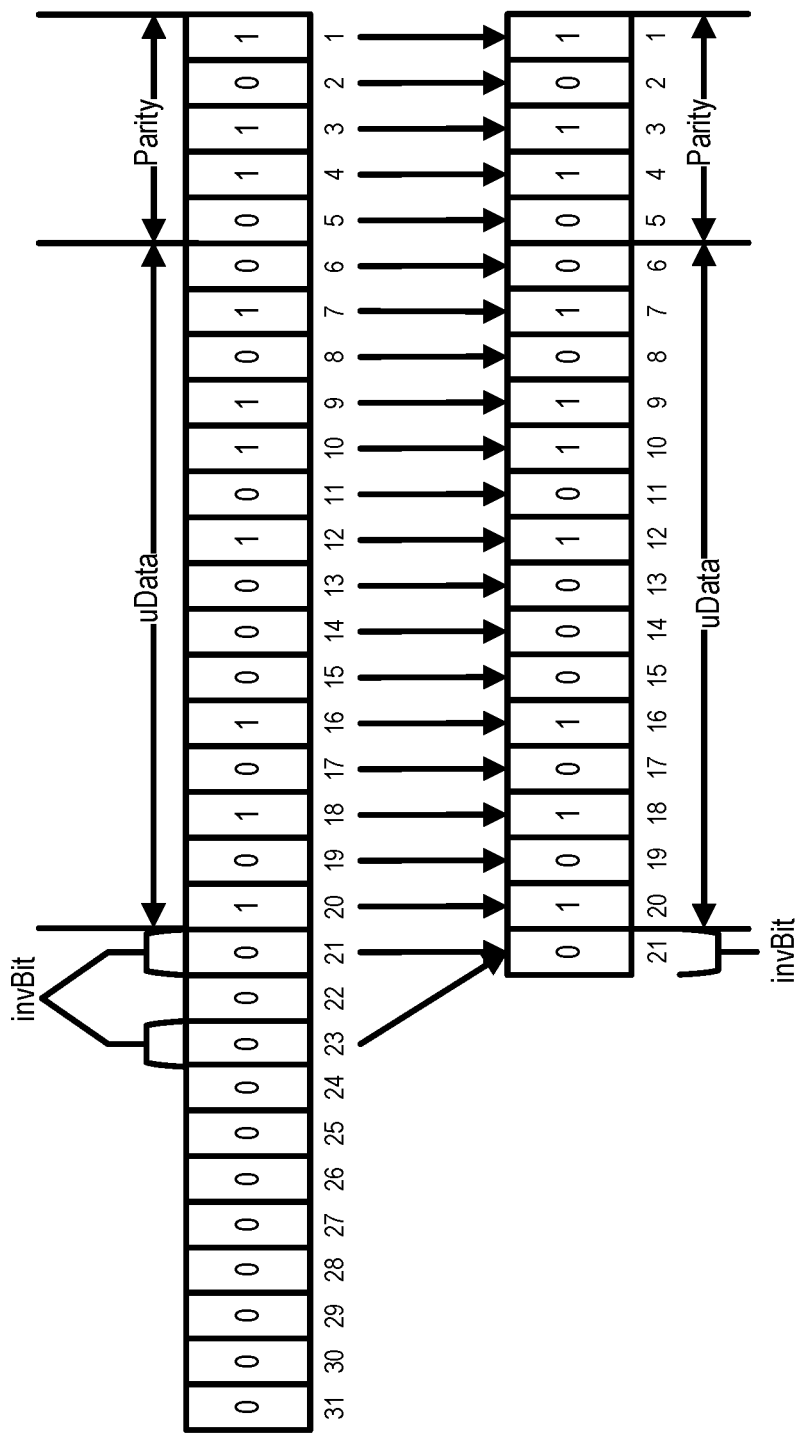
FIG. 24 shows an example compressed shortened BCH codeword using the shortened BCH codeword in accordance with one or more embodiments.

At operation 1707, the compressor 1803 of the encoding system 116A may compress the shortened BCH codeword to form a compressed shortened BCH codeword according to the BCH codeword template generated by the codeword template generator 118 and per the method 700. Compressing the shortened BCH codeword may include replacing the expanded inversion bit (invBit) and user data bits (uData) of the shortened BCH codeword with the original inversion bit (invBit) and user data bits (uData). FIG. 24 shows an example compressed shortened BCH codeword using the shortened BCH codeword of FIG. 23. As shown in FIG. 24, compression is achieved by eliminating one or more bits from the shortened BCH codeword in the compressed shortened BCH codeword (e.g., bit 22). Following compression of the shortened BCH codeword to produce the compressed shortened BCH codeword, the encoding system 116A stores the compressed shortened BCH codeword in the memory devices $106_1$-$106_R$ at operation 1709. In this compressed form, the shortened BCH codeword may be inverted while maintaining the shortened BCH codeword as a valid BCH codeword once expanded. This will allow the shortened BCH codeword to be decoded after being inverted, as will be described in further detail below.

Figure 25:
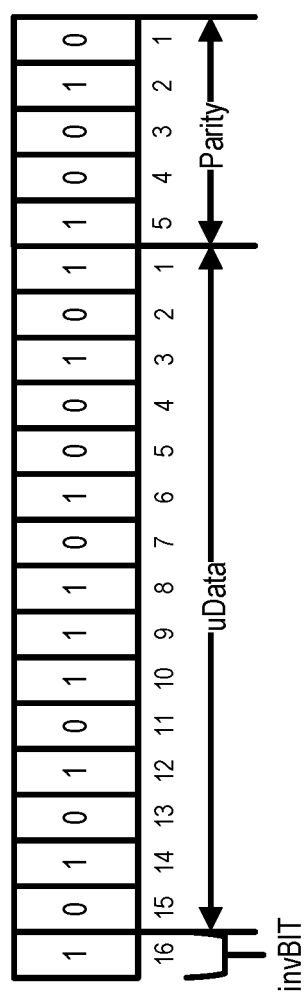
FIG. 25 shows an example of the inversion of the bits in the compressed shortened BCH codeword in accordance with one or more embodiments.

The compressed shortened BCH codeword may stay stored in the memory devices $106_1$-$106_R$ awaiting an access request from a host system 112. As shown in FIGS. 17A and 17B, at operation 1711 the controller 104 may continually determine if an access request has been received for the user data bits (uData) from a host system 112. Upon detecting that a request for the user data bits (uData) has not been received from a host system 112, the method 1700 may move to operation 1713. At operation 1713, the controller 104 detects whether an event has occurred. In one embodiment, the event is the passage of a predefined time since the compressed shortened BCH codeword was last stored in the memory devices $106_1$-$106_R$. For example, the event may be the passage of one-hundred milliseconds since the compressed shortened BCH codeword was stored in the memory devices $106_1$-$106_R$. Upon failing to detect an event, the method 1700 returns to operation 1711 to determine if an access request for the user data bits (uData) has been received. Conversely, upon detecting an event at operation 1713, the inverting system 116B retrieves the compressed shortened BCH codeword from the memory devices $106_1$-$106_R$ at operation 1715. At operation 1717, an inverter 502 of the inverting system 116B may invert each bit in the compressed shortened BCH codeword and, at operation 1719, the inverting system 116B may store the result in the memory devices $106_1$-$106_R$. FIG. 25 shows an example of the inversion of the bits in the compressed shortened BCH codeword of FIG. 24. By periodically inverting the compressed shortened BCH codeword, imprint issues to the memory devices $106_1$-$106_R$ may be avoided. Following operation 1719, the method 1700 may return to operation 1711 to determine if an access request from the host system 112 has been received.

Figure 20:
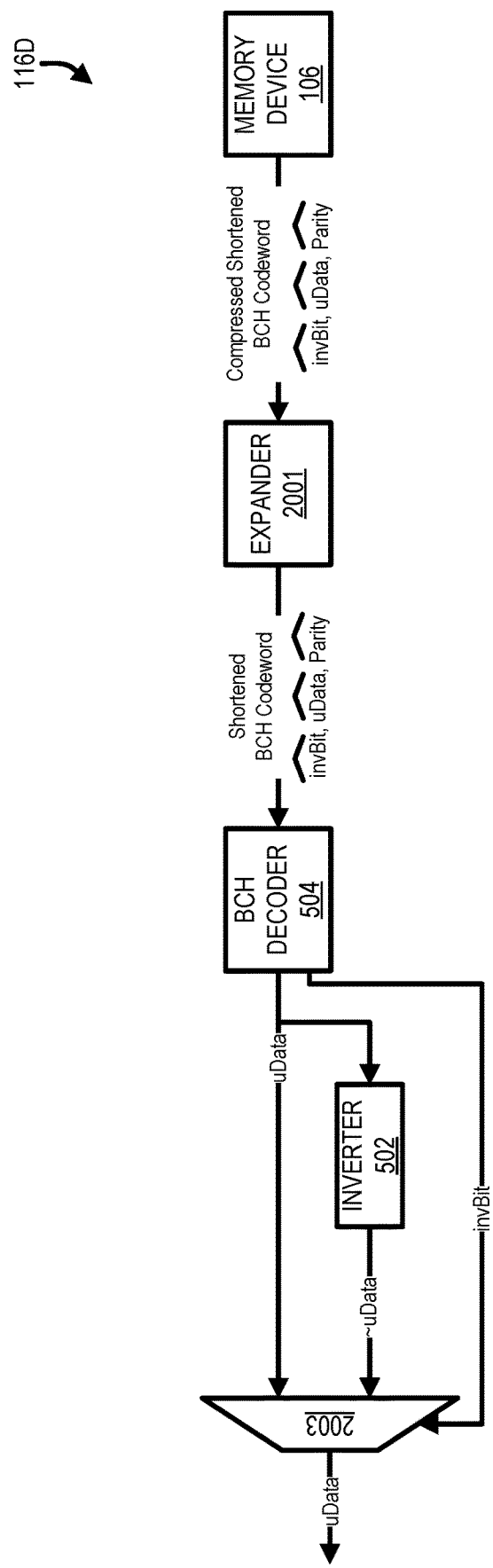
FIG. 20 shows a decoding system in accordance with one or more embodiments.

Upon the controller 104 determining at operation 1711 that a request for access to the user data bits (uData) has been received from a host system 112, the decoding system 116C may retrieve the compressed shortened BCH codeword stored in the memory devices $106_1$-$106_R$ at operation 1721. As shown in FIG. 20, the decoding system 116C may include an expander 2001. The expander 2001 may retrieve the compressed shortened BCH codeword from the memory devices $106_1$-$106_R$ at operation 1721. At operation 1723, the expander 2001 may expand the compressed shortened BCH codeword into the original shortened BCH codeword based on the BCH codeword template provided by the codeword template generator 118 such that the BCH decoder 504 may decode the shortened BCH codeword at operation 1725. For example, the BCH decoder 504 uses the parity bits (Parity) of the shortened BCH codeword to correct for any errors introduced to the shortened BCH codeword while stored in the memory devices $106_1$-$106_R$.

At operation 1727, the inverter 502 may invert the user data bits (uData) produced by the BCH decoder 504. The multiplexer 2003 may selectively output either the inverted user data bits (~uData) or the user data bits (uData) received directly from the BCH decoder 504 based on the inversion bit (invBit) received from the BCH decoder 504. In particular, when the inversion bit (invBit) indicates that the shortened BCH codeword was stored in an inverted state while in the memory elements $106_1$-$106_R$, the multiplexer 2003 may output the inverted user data bits (~uData). Otherwise, the multiplexer 2003 may output the user data bits (uData) received directly from the BCH decoder 504.

As described above, systems, devices, and techniques have been described that generate invertible, shortened BCH codewords. In particular, a BCH codeword template may be used for determining the placement of inversion, user data, and parity bits in a shortened BCH codeword. The placement of the bits may be used for expanding the inversion and user data bits when encoding and decoding the codeword and compressing the inversion and user data bits during storage such that inversion may be performed. This process ensures that shortened BCH codewords generated using the BCH codeword template remain valid codewords (e.g., inverted parity bits correct for errors in a user data bit portion of the shortened BCH codeword without mis-correction)

The operations in the method diagrams presented herein were described with reference to the exemplary implementations of the other figures. However, it should be understood that the operations of the diagrams can be performed by implementations other than those discussed with reference to the other figures, and the implementations discussed with reference to these other figures can perform operations different than those discussed with reference to the diagrams. Although described and shown in a particular order, the operations of the methods presented herein are not restricted to this order. For example, one or more of the operations of the methods presented herein may be performed in a different order or in partially or fully overlapping time periods. Accordingly, the description and depiction of the methods are for illustrative purposes and are not intended to restrict to a particular implementation.

It will be apparent from this description that aspects of the disclosure may be embodied, at least in part, in software or firmware. That is, a computer system or other data processing system, codeword manager 116 of the controller 104, may carry out the computer-implemented methods 700 and/or 1700 in response to its processor or other circuitry executing sequences of instructions contained in local memory/storage 110 or another non-transitory machine-readable storage medium. The software may further be transmitted or received over a network (not shown) via a network interface. In various embodiments, hardwired circuitry may be used in combination with the software instructions to implement the present embodiments. It will also be appreciated that additional components, not shown, may also be part of computing system 100, and, in some embodiments, fewer components than that shown in FIG. 1 may also be used in computing system 100.

An article of manufacture may be used to store program code providing at least some of the functionality of the embodiments described above. Additionally, an article of manufacture may be used to store program code created using at least some of the functionality of the embodiments described above. An article of manufacture that stores program code may be embodied as, but is not limited to, one or more memories (e.g., one or more flash memories, random access memories—static, dynamic, or other), optical disks, CD-ROMs, DVD-ROMs, EPROMs, EEPROMs, magnetic or optical cards or other type of non-transitory machine-readable media suitable for storing electronic instructions. Additionally, embodiments of the invention may be implemented in, but not limited to, hardware or firmware utilizing an FPGA, ASIC, a processor, a computer, or a computer system including a network. Modules and components of hardware or software implementations can be divided or combined without significantly altering embodiments of the invention.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other.

In the foregoing specification, the invention has been described with reference to specific exemplary embodiments thereof. Various embodiments and aspects of the invention (s) are described with reference to details discussed in this document, and the accompanying drawings illustrate the various embodiments. The description above and drawings are illustrative of the invention and are not to be construed as limiting the invention. References in the specification to "one embodiment," "an embodiment," "an exemplary embodiment," etc., indicate that the embodiment described may include a particular feature, structure, or characteristic, but not every embodiment may necessarily include the particular feature, structure, or characteristic. Moreover, such phrases are not necessarily referring to the same embodiment. Furthermore, when a particular feature, structure, or characteristic is described in connection with an embodiment, such feature, structure, or characteristic may be implemented in connection with other embodiments whether or not explicitly described. Additionally, as used in this document, the term "exemplary" refers to embodiments that serve as simply an example or illustration. The use of exemplary should not be construed as an indication of preferred examples. Blocks with dashed borders (e.g., large dashes, small dashes, dot-dash, dots) are used to illustrate optional operations that add additional features to embodiments of the invention. However, such notation should not be taken to mean that these are the only options or optional operations, and/or that blocks with solid borders are not optional in some embodiments of the invention. Numerous specific details are described to provide a thorough understanding of various embodiments of the present invention. However, in certain instances, well-known or conventional details are not described in order to provide a concise discussion of embodiments of the present inventions.

It will be evident that various modifications may be made thereto without departing from the broader spirit and scope of the invention as set forth in the following claims. For example, the methods described in this document may be performed with fewer or more features/blocks or the features/blocks may be performed in differing orders. Additionally, the method(s) described in this document may be repeated or performed in parallel with one another or in parallel with different instances of the same or similar methods. While examples refer to memory and non-volatile storage media, embodiments may also be implemented with other types of storage media.

What is claimed is:

1. A computer-implemented method for using invertible, shortened codewords, comprising:
    receiving a request to store user data bits in a set of memory devices;
    expanding the user data bits and an inversion bit to bit locations of a codeword template, wherein the expanding forms expanded inversion and user data bits that collectively include additional bits to represent the user data bits and the inversion bit, wherein the inversion bit indicates whether the user data bits are inverted, wherein the codeword template maps a first set of bit positions corresponding to the user data bits and the inversion bit to a second set of bit positions corresponding to the expanded inversion and user data bits;
    generating parity bits for the expanded inversion and user data bits to form a shortened codeword, wherein the shortened codeword comprises the expanded inversion and user data bits, and the parity bits;
    compressing the shortened codeword to form a compressed shortened codeword, wherein the compressed shortened codeword has fewer bits than the shortened codeword; and
    storing the compressed shortened codeword in the set of memory devices.

2. The computer-implemented method of claim 1, wherein the shortened codeword comprises one or more bits that a decoder determines are "zeroes" without reading corresponding portions of the shortened codeword.

3. The computer-implemented method of claim 1, further comprising:
    detecting an event associated with the compressed shortened codeword; and
    in response to detecting the event, inverting the compressed shortened codeword such that the compressed shortened codeword is stored in the set of memory devices in an inverted state.

4. The computer-implemented method of claim 3, wherein the event is passage of a predefined time since storing the compressed shortened codeword in the set of memory devices.

5. The computer-implemented method of claim 1, further comprising:
    receiving a request for the user data bits from a host system;
    expanding, in response to receiving the request for the user data bits, the compressed shortened codeword according to the codeword template to form the shortened codeword;
    decoding the shortened codeword to generate a user data bit output and the inversion bit; and
    outputting, to the host system, the user data bit output or an inverted version of the user data bit output based on a value of the inversion bit.

6. The computer-implemented method of claim 1, further comprising:
    determining a length for an inversion and user data bit portion of a vector of bits, wherein the inversion and user data bit portion of the vector comprises "ones" for all bit positions;
    increasing the length of the inversion and user data bit portion of the vector until a number of "ones" in the inversion and user data bit portion and the parity bits generated for the inversion and user data bit portion of the vector is greater than the selected length of the inversion and user data bit portion of the vector;

rotating the vector to place the vector in systematic form such that the inversion and user data bit portion of the vector is placed in the least significant bits side of the vector;

selecting, and starting with the most significant bits of the vector, a first set of bit positions that have a value of one to denote the inversion bit;

selecting, and starting with the least significant bits of the vector, a second set of bit positions to denote the parity bits; and selecting a third set of bit positions that have not been selected for the inversion bit or the parity bits to denote the user data bits, wherein the selections of the first set of bit positions, the second set of bit positions, and the third set of bit positions collectively represent the codeword template.

7. A system comprising:
a memory device; and
a processing device, operatively coupled with the memory device, to:
receive a request to store user data bits to the memory device expand the user data bits and an inversion bit to bit locations of a codeword template, wherein the expanding forms expanded inversion and user data bits that collectively include additional bits to represent the user data bits and the inversion bit, wherein the inversion bit indicates whether the user data bits are inverted, wherein the codeword template maps a first set of bit positions corresponding to the user data bits and the inversion bit to a second set of bit positions corresponding to the expanded inversion and user data bits,
generate parity bits for the expanded inversion and user data bits to form a shortened codeword, wherein the shortened codeword comprises the expanded inversion and user data bits, and the parity bits,
compress the shortened codeword to form a compressed shortened codeword, wherein the compressed shortened codeword has fewer bits than the shortened codeword, and
store the compressed shortened codeword in the set of memory devices.

8. The system of claim 7, wherein the shortened codeword comprises one or more bits that a decoder determines are "zeroes" without reading corresponding portions of the shortened codeword.

9. The system of claim 7, wherein the processing device is further to:
detect an event associated with the compressed shortened codeword; and
in response to detecting the event, invert the compressed shortened codeword such that the compressed shortened codeword is stored in the set of memory devices in an inverted state.

10. The system of claim 9, wherein the event is passage of a predefined time since storing the compressed shortened codeword in the set of memory devices.

11. The system of claim 7, wherein the processing device is further to:
receive a request for the user data bits from a host system;
expand, in response to receiving the request for the user data bits, the compressed shortened codeword according to the codeword template to form the shortened codeword;

decode the shortened codeword to generate a user data bit output and the inversion bit; and output the user data bit output or an inverted version of the user data bit output based on a value of the inversion bit.

12. The system of claim 7, wherein the processing device is further to:
determine a length for an inversion and user data bit portion of a vector of bits, wherein the inversion and user data bit portion of the vector comprises "ones" for all bit positions;
increase the length of the inversion and user data bit portion of the vector until a number of "ones" in the inversion and user data bit portion and the parity bits generated for the inversion and user data bit portion of the vector is greater than the selected length of the inversion and user data bit portion of the vector;
rotate the vector to place the vector in systematic form such that the inversion and user data bit portion of the vector is placed in the least significant bits side of the vector;
select, starting with the most significant bits of the vector, a first set of bit positions that have a value of one to denote the inversion bit;
select, starting with the least significant bits of the vector, a second set of bit positions to denote the parity bits; and
select a third set of bit position that have not been selected for the inversion bit or the parity bits to denote the user data bits,
wherein the selections of the first set of bit positions, the second set of bit positions, and the third set of bit positions collectively represent the codeword template.

13. A non-transitory machine-readable storage medium, which stores instructions that, when executed by a processor of a controller, cause the controller to:
expand user data bits and an inversion bit to bit locations of a codeword template, wherein the expanding forms expanded inversion and user data bits that collectively include additional bits to represent the user data bits and the inversion bit, wherein the inversion bit indicates whether the user data bits are inverted, wherein the codeword template maps a first set of bit positions corresponding to the user data bits and the inversion bit to a second set of bit positions corresponding to the expanded inversion and user data bits;
generate parity bits for the expanded inversion and user data bits to form a shortened codeword, wherein the shortened codeword comprises the expanded inversion and user data bits, and the parity bits;
compress the shortened codeword to form a compressed shortened codeword, wherein the compressed shortened codeword has fewer bits than the shortened codeword; and
store the compressed shortened codeword in a set of memory devices.

14. The non-transitory machine-readable storage medium of claim 13, wherein the shortened codeword comprises one or more bits that a decoder determines are "zeroes" without reading corresponding portions of the shortened codeword.

15. The non-transitory machine-readable storage medium of claim 13, wherein the instructions further cause to the memory controller to:
detect an event associated with the compressed shortened codeword; and in response to detecting the event, invert the compressed shortened codeword such that the compressed shortened codeword is stored in the set of memory devices in an inverted state.

16. The non-transitory machine-readable storage medium of claim 15, wherein the event is the passage of a predefined time since storing the compressed shortened codeword in the set of memory devices.

17. The non-transitory machine-readable storage medium of claim 13, wherein the instructions further cause to the memory controller to:

receive a request for the user data bits from a host system;

expand, in response to receiving the request for the user data bits, the compressed shortened codeword according to the codeword template to form the shortened codeword;

decode the shortened codeword to generate a user data bit output and the inversion bit; and output, to the host system, the user data bit output or an inverted version of the user data bit output based on a value of the inversion bit.

18. The non-transitory machine-readable storage medium of claim 13, wherein the instructions further cause to the memory controller to:

determine a length for an inversion and user data bit portion of a vector of bits, wherein the inversion and user data bit portion of the vector comprises "ones" for all bit positions;

increase the length of the inversion and user data bit portion of the vector until a number of "ones" in the inversion and user data bit portion and the parity bits generated for the inversion and user data bit portion of the vector is greater than the selected length of the inversion and user data bit portion of the vector;

rotate the vector to place the vector in systematic form such that the inversion and user data bit portion of the vector is placed in the least significant bits side of the vector;

select, starting with the most significant bits of the vector, a first set of bit positions that have a value of one to denote the inversion bit;

select, starting with the least significant bits of the vector, a second set of bit positions to denote the parity bits; and select a third set of bit position that have not been selected for the inversion bit or the parity bits to denote the user data bits, wherein the selections of the first set of bit positions, the second set of bit positions, and the third set of bit positions collectively represent the codeword template.

* * * * *